(12) United States Patent
Kwak et al.

(10) Patent No.: US 12,382,762 B2
(45) Date of Patent: Aug. 5, 2025

(54) LIGHT EMITTING DEVICE SUBSTRATE AND LIGHT EMITTING DEVICE PACKAGE INCLUDING THE SAME

(71) Applicant: SAMSUNG ELECTRONICS CO., LTD., Suwon-si (KR)

(72) Inventors: Changhoon Kwak, Hwaseong-si (KR); Moonsub Kim, Suwon-si (KR); Seokman Cho, Seoul (KR); Myoungsun Ha, Suwon-si (KR); Sujong Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 557 days.

(21) Appl. No.: 17/318,146

(22) Filed: May 12, 2021

(65) Prior Publication Data
US 2021/0359187 A1 Nov. 18, 2021

(30) Foreign Application Priority Data
May 18, 2020 (KR) ........................ 10-2020-0059327

(51) Int. Cl.
*H10H 20/857* (2025.01)
*H10H 20/831* (2025.01)
(Continued)

(52) U.S. Cl.
CPC ...... *H10H 20/857* (2025.01); *H10H 20/8312* (2025.01); *H10H 20/8506* (2025.01); *H10H 29/142* (2025.01)

(58) Field of Classification Search
CPC ......... G09G 3/32; H01L 33/486; H01L 33/62; H01L 24/10; H01L 27/156; H01L 27/153;
(Continued)

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

CN   109257872 A        1/2019
KR   10-2015-0094739 A  8/2015
KR   10-2017-0101056 A  9/2017

OTHER PUBLICATIONS

Notice of Allowance in Korean Appln. No. 10-2020-0059327, mailed on May 19, 2025, 6 pages (with English translation).

*Primary Examiner* — Matthew C Landau
*Assistant Examiner* — Halee Cramer
(74) *Attorney, Agent, or Firm* — Fish & Richardson P.C.

(57) ABSTRACT

A light emitting device substrate includes an insulating layer, a plurality of upper pads spaced apart from each other in a matrix pattern on the insulating layer, a first circuit pattern inside the insulating layer, the first circuit pattern electrically connecting some of the plurality of upper pads to each other, a second circuit pattern inside the insulating layer, the second circuit pattern being under the first circuit pattern and electrically connected to the first circuit pattern, and a plurality of lower pads spaced apart from each other under the insulating layer, a number of the plurality of lower pads being smaller than a number of the plurality of upper pads, and at least one of the plurality of lower pads being electrically connected to two or more upper pads of the plurality of upper pads via the first circuit pattern and the second circuit pattern.

16 Claims, 28 Drawing Sheets

(51) Int. Cl.
*H10H 20/85* (2025.01)
*H10H 29/14* (2025.01)

(58) Field of Classification Search
CPC ............ H01L 23/495; H01L 23/49833; H01L 25/0753; H10H 20/857; H10H 29/142
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,666,561 B2 | 5/2017 | Choi et al. | |
| 9,899,418 B2 | 2/2018 | Pfeuffer et al. | |
| 10,062,810 B2 | 8/2018 | Chae et al. | |
| 10,256,218 B2 | 4/2019 | Kim et al. | |
| 10,333,042 B1 | 6/2019 | Liu et al. | |
| 10,453,827 B1 | 10/2019 | Hussell et al. | |
| 2014/0145222 A1* | 5/2014 | Yang | H05K 5/10 257/98 |
| 2016/0293811 A1* | 10/2016 | Hussell | H10H 20/857 |
| 2017/0179352 A1* | 6/2017 | Song | H10H 20/857 |
| 2018/0358527 A1 | 12/2018 | Mehnert | |
| 2019/0067255 A1 | 2/2019 | Lim et al. | |
| 2019/0355294 A1 | 11/2019 | Gu et al. | |
| 2019/0371974 A1* | 12/2019 | Hussell | H10H 20/852 |
| 2020/0013759 A1 | 1/2020 | Yoo et al. | |
| 2020/0027918 A1 | 1/2020 | Chen et al. | |
| 2020/0083420 A1* | 3/2020 | Gu | H01L 23/5383 |
| 2020/0313056 A1* | 10/2020 | Hong | H10H 20/857 |

* cited by examiner

LIGHT EMITTING DEVICE SUBSTRATE AND LIGHT EMITTING DEVICE PACKAGE INCLUDING THE SAME

CROSS-REFERENCE TO RELATED APPLICATION

Korean Patent Application No. 10-2020-0059327, filed on May 18, 2020, in the Korean Intellectual Property Office, and entitled: "Light Emitting Device Substrate and Light Emitting Device Package Including the Same," is incorporated by reference herein in its entirety.

BACKGROUND

1. Field

Embodiments relate to a substrate and a package including the same, and more particularly, to a substrate for mounting a light emitting device chip thereon and a light emitting device package including the same.

2. Description of the Related Art

A light emitting device chip may be mounted on a substrate, and may be electrically connected to circuit patterns inside the substrate. For example, the light emitting device chip may be mounted on a pad on the substrate, and may be electrically connected to the circuit patterns inside the substrate. In addition, to electrically connect the light emitting device chip to the pad of the substrate, a connecting member, e.g., a solder ball, may be between the light emitting device chip and the pad of the substrate.

SUMMARY

According to an aspect of embodiments, there is provided a light emitting device substrate including an insulating layer, a plurality of upper pads that are apart from each other in a matrix shape on the insulating layer, a first circuit pattern that is inside the insulating layer and electrically connecting some of the plurality of upper pads to each other, a second circuit pattern that is under the first circuit pattern inside the insulating layer, and electrically connected to the first circuit pattern, and a plurality of lower pads that are apart from each other under the insulating layer, and provided in a smaller number than the plurality of upper pads, wherein at least one of the plurality of lower pads is electrically connected to two or more upper pads via the first circuit pattern and the second circuit pattern.

According to another aspect of embodiments, there is provided a light emitting device substrate configured to define an M*N matrix including M rows and N columns (M and N are integers of one or more), wherein an entry constituting the matrix defines a pixel in which a plurality of upper pads are arranged, the light emitting device substrate including: an insulating layer, and a plurality of upper pads that are in the pixel on the insulating layer, and include a first pad group including a first anode upper pad and a first cathode upper pad, wherein the insulating layer between the first anode upper pad and the first cathode upper pad has an uneven structure shape in which concaveness and convexity are repeated.

According to yet another aspect of embodiments, there is provided a light emitting device package including: a light emitting device chip including a chip pad, a light emitting device substrate having the light emitting device chip mounted thereon, the light emitting device substrate including: an insulating layer, a plurality of upper pads that are apart from each other on the insulating layer and have an identical dimension, a first circuit pattern that is inside the insulating layer, and electrically connecting some upper pads among the plurality of upper pads, a second circuit pattern that is under the first circuit pattern inside the insulating layer, and electrically connecting the first circuit pattern to a second circuit pattern, and a plurality of lower pads being apart from each other under the insulating layer, at least one lower pad among the plurality of lower pads being electrically connected to two or more upper pads via the first circuit pattern and the second circuit pattern, and a connecting member between the chip pad and the plurality of upper pads, and electrically connecting the light emitting device chip to the light emitting device substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
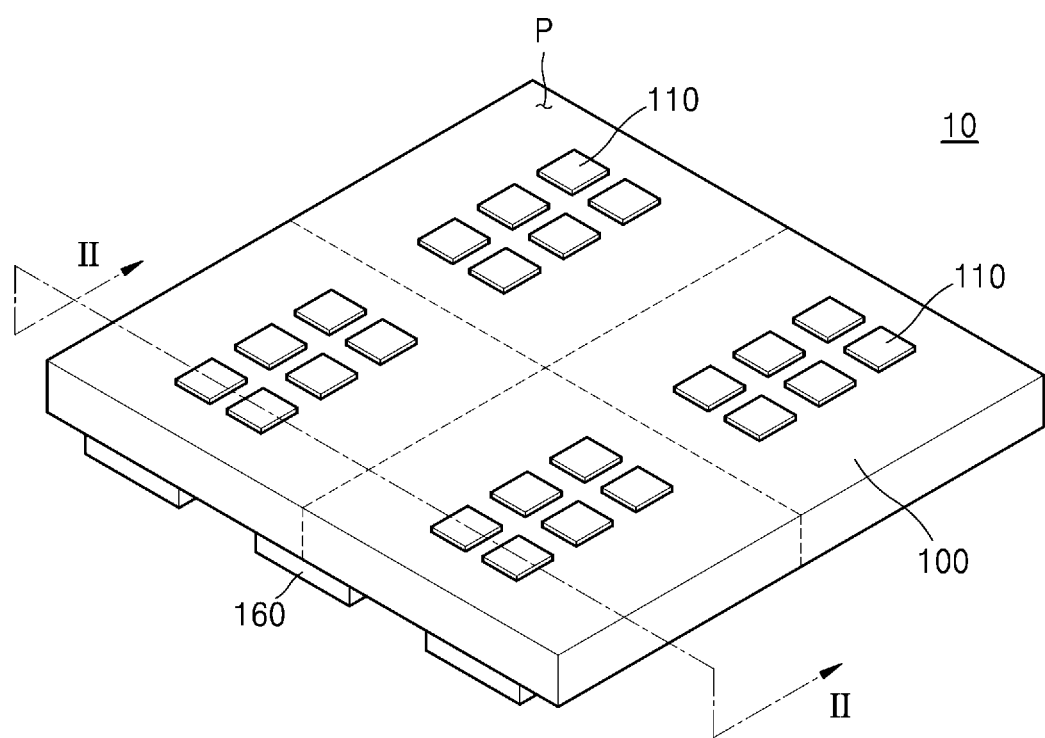
FIG. 1 is a perspective view of a light emitting device substrate, according to an example embodiment.
Figure 2:
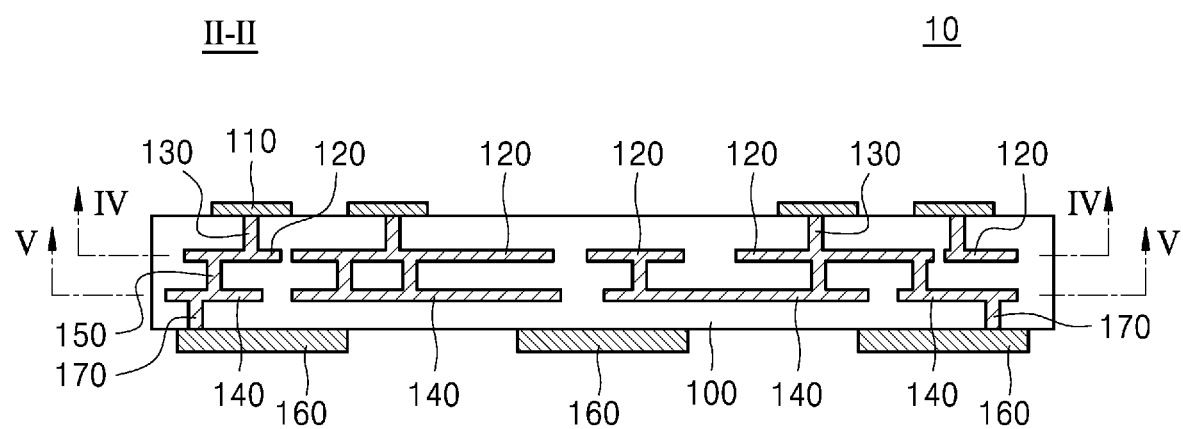
FIG. 2 is a cross-sectional view along line II-II in FIG. 1.

FIG. 1 is a perspective view of a light emitting device substrate 10, according to an example embodiment, and FIG. 2 is a cross-sectional view along line II-II in FIG. 1.

Figure 17:
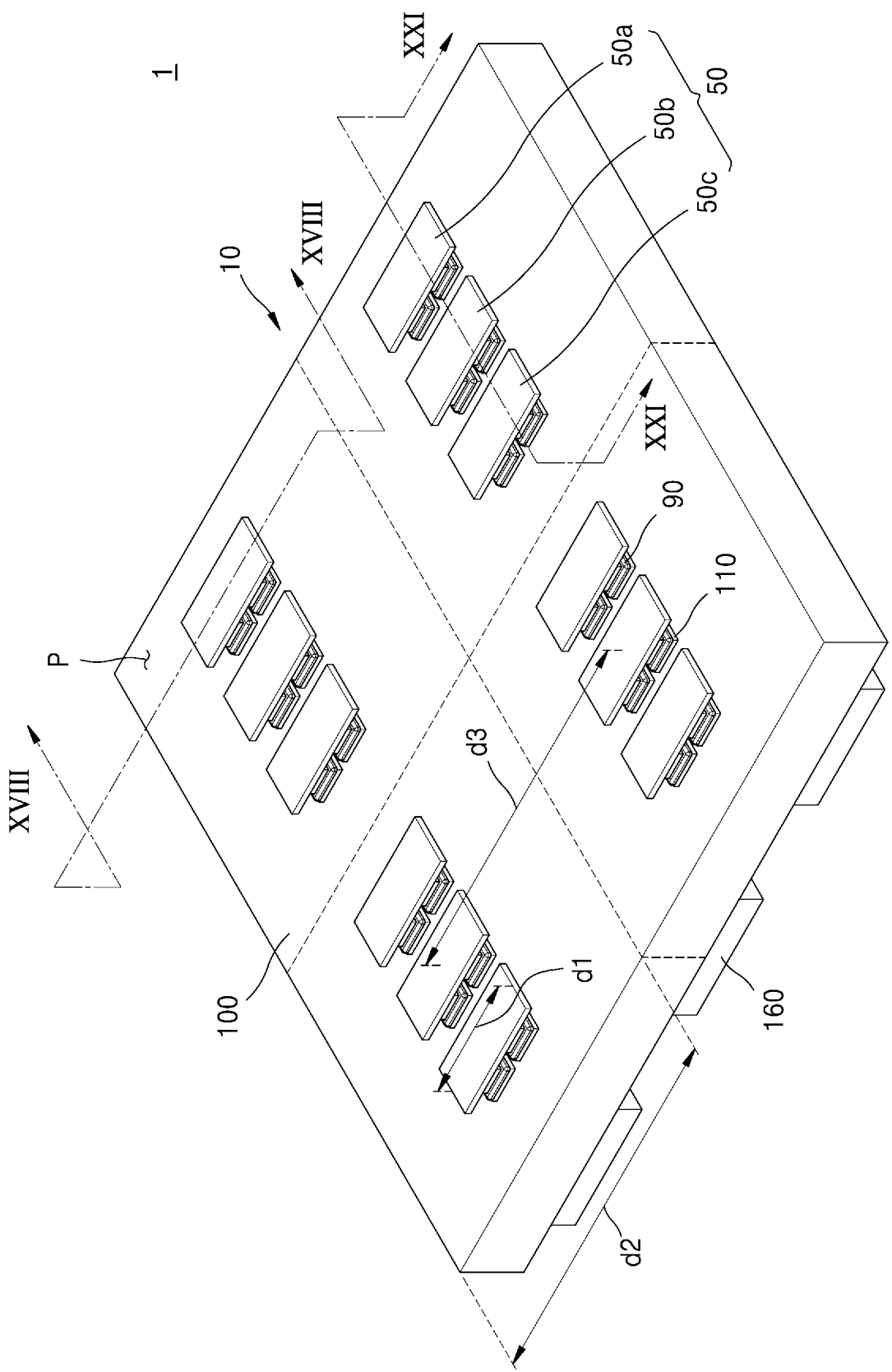
FIG. 17 is a perspective view of a light emitting device package, according to an example embodiment.

The light emitting device substrate 10 may include a substrate for mounting a light emitting device chip (50 in FIG. 17). For example, the light emitting device substrate 10 may include a printed circuit board (PCB). However, embodiments are not limited thereto, and the light emitting device substrate 10 may include a carrier, a wafer, and the like.

Referring to FIGS. 1 and 2, the light emitting device substrate 10 may include an insulating layer 100, a plurality of upper pads 110, a first circuit pattern 120, a first conductive via 130, a second circuit pattern 140, a second conductive via 150, a plurality of lower pads 160, a third conductive via 170, etc.

The light emitting device substrate 10 may define an M*N matrix including M rows and N columns (M and N are integers of 1 or more). For example, the light emitting device substrate 10 may include a plurality of regions, e.g., may be divided into M*N regions arranged into a matrix pattern including M rows and N columns. For example, the light emitting device substrate 10, as illustrated in FIG. 1, may define a 2*2 matrix including two rows and two columns, e.g., may be divided by an imaginary line (dashed line in figure) into a 2*2 matrix as viewed in a top view.

In addition, each of entries constituting the M*N matrix of the light emitting device substrate 10 may define a pixel P, e.g., each of the regions of the light emitting device substrate 10 defined by the M*N matrix may define one pixel P. For example, as illustrated in FIG. 1, each of the four entries constituting the 2*2 matrix of the light emitting device substrate 10 may define the pixel P. In other words, the light emitting device substrate 10 of FIG. 1 may define a 2*2 matrix, and may have four pixels P arranged in a 2*2 matrix. However, embodiments are not limited thereto, and the light emitting device substrate 10 may include any suitable matrix size, e.g., a 1*1 matrix including one pixel P, a 3*3 matrix having nine pixels P, etc.

The insulating layer 100 of the light emitting device substrate 10 may be a layer forming the appearance of the light emitting device substrate 10. In addition, the insulating layer 100 may protect the first circuit pattern 120 and the second circuit pattern 140 from external shocks, and surround the first circuit pattern 120 and the second circuit pattern 140 to prevent the first circuit pattern 120 and the second circuit pattern 140 from shorts. For example, as illustrated in FIG. 2, the first circuit pattern 120 and the second circuit pattern 140 may be embedded at a predetermined depth within the insulating layer 100.

In an example embodiment, the insulating layer 100 may include at least one insulating material of, e.g., epoxy resin, polybenzobisoxazole (PBO), benzocyclobutene (BCB), polyimide, and polyimide derivative. However, embodiments are not limited thereto.

The plurality of upper pads 110 of the light emitting device substrate 10 may be pads provided on the insulating layer 100. In addition, the plurality of upper pads 110 may be pads electrically connected to the light emitting device chip (50 in FIG. 17).

In an example embodiment, the plurality of upper pads 110 may be spaced apart from each other on the insulating layer 100. In other words, the plurality of upper pads 110 may not be connected but may be apart from each other on the insulating layer 100.

In an example embodiment, the plurality of upper pads 110 may have substantially the same shape, size, and thickness. In other words, dimensions of the plurality of upper pads 110 may be identical to each other. For example, each of the plurality of upper pads 110 may have a cuboid shape, e.g., a quadrangular top view, having substantially the same size and thickness. However, embodiments are not limited thereto, e.g., the plurality of upper pads 110 may have a cylindrical shape having substantially the same size and thickness. The substantial identicality described above may include literal identicality or similarity with a difference within an error range of about 5%.

In an example embodiment, the plurality of upper pads 110 may be arranged in a matrix shape. For example, the plurality of upper pads 110 may be arranged in the shape of an M*N matrix including M rows and N columns (M and N are integers of 1 or more), e.g., in each pixel P. For example, as illustrated in FIG. 1, the plurality of upper pads 110 may have substantially the same shape and size, and may be arranged in a 3*2 matrix within one pixel P.

In an example embodiment, in a plan view of the light emitting device substrate 10, the plurality of upper pads 110 may be arranged in a similar shape to a plurality of islands of the same shape and size having a certain pattern in the sea. For example, as illustrated in FIG. 1, each of the plurality of upper pads 110, according to embodiments, may be a discrete structure, e.g., completely, separated and disconnected from others of the plurality of upper pads 110 in a top view, e.g., to have a reduced size of an upper surface exposed above an upper surface of the insulating layer 100.

In contrast, if some of the plurality of upper pads 110 were to be interconnected with each other on the insulating layer 100, e.g., above the upper surface of the insulating layer 100, an area of upper surfaces of such interconnected upper pads 110 would have been five times or more greater than an area of a chip pad (520 in FIG. 17) of a light emitting device chip (50 of FIG. 17). Accordingly, a connecting member, e.g., a solder ball, between such interconnected upper pads 110 and the chip pad 520 would have had a relatively large area and a small height, e.g., thickness, thereby reducing bonding reliability between the light emitting device chip 50 and the light emitting device substrate 10, e.g., due to the small height of the connecting member.

In detail, some of the plurality of upper pads 110 of the light emitting device substrate 10 may be electrically interconnected inside, e.g., at a predetermined depth within, the insulating layer 100 via the first circuit pattern 120 and the second circuit pattern 140 to be described later. However, on the upper surface of the insulating layer 100, the plurality of upper pads 110 may be spaced apart from each other without being interconnected, e.g., in a top view (FIG. 1).

In addition, since the plurality of upper pads 110 on the upper surface of the insulating layer 100 are not connected to each other, the area of the upper surface of each of the plurality of upper pads 110 may be about 1.0 to about 4.5 times the area of the chip pad 520 of the light emitting device chip (50 in FIG. 17), e.g., as compared to five times or larger if the upper pads 110 were too be interconnected on the top surface of the insulating layer 100. Accordingly, a connecting member (90 in FIG. 17), e.g., a solder ball, between the upper pad 110 and the chip pad 520 may have a relatively small area and a large height, thereby improving the bonding reliability between the light emitting device chip 50 and the light emitting device substrate 10, e.g., because of the large height of the connecting member 90. The technical idea of the plurality of upper pads 110 is described in more detail below with reference to FIG. 3.

Referring back to FIG. 2, the first circuit pattern 120 of the light emitting device substrate 10 may be in the insulating layer 100, and may include a circuit pattern configured to electrically connect some of the plurality of upper pads 110 to each other. The first circuit pattern 120 may be surrounded by the insulating layer 100, e.g., the first circuit pattern 120 may be embedded at a predetermined depth inside the insulating layer 100.

In an example embodiment, the first circuit pattern 120 may include a metal, e.g., at least one of copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or a conductive material including an alloy thereof. The technical idea of the first circuit pattern 120 is described in more detail below with reference to FIG. 4.

The first conductive via 130 of the light emitting device substrate 10 may connect, e.g., each of, the plurality of upper pads 110 to the first circuit pattern 120. The first conductive via 130 may penetrate a portion of the insulating layer 100 in a vertical direction, and connect the plurality of upper pads 110 to the first circuit pattern 120. For example, the first conductive via 130 may contact a portion of the lower surface of the plurality of upper pads 110 and a portion of an upper surface of the first circuit pattern 120.

In an example embodiment, the first conductive via 130 may include a metal, e.g., at least one of copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or a conductive material including an alloy thereof. In addition, the first conductive via 130 may include a material that is substantially the same as the first circuit pattern 120.

The second circuit pattern 140 of the light emitting device substrate 10 may be inside the insulating layer 100, e.g., the second circuit pattern 140 may be embedded at a predetermined depth inside the insulating layer 100, and may be under the first circuit pattern 120. In addition, the second circuit pattern 140 may electrically connect some of the circuit patterns of the first circuit pattern 120 to be electrically connected to some of the plurality of upper pads 110. The second circuit pattern 140 may be surrounded by the insulating layer 100.

In an example embodiment, the second circuit pattern 140 may include a material that is substantially the same as the conductive material of the first circuit pattern 120 described above. The technical idea of the second circuit pattern 140 is described in more detail below with reference to FIG. 5.

The second conductive via 150 of the light emitting device substrate 10 may connect the first circuit pattern 120 to the second circuit pattern 140. The second conductive via 150 may penetrate a portion of the insulating layer 100 in a vertical direction, and connect the first circuit pattern 120 to the second circuit pattern 140. For example, the second conductive via 150 may contact a portion of a lower surface of the first circuit pattern 120 and a portion of an upper surface of the second circuit pattern 140. In an example embodiment, the second conductive via 150 may include substantially the same material as the first circuit pattern 120, the second circuit pattern 140, and the first conductive via 130.

The plurality of lower pads 160 of the light emitting device substrate 10 may be pads provided under the insulating layer 100, i.e., on a lower surface of the light emitting device substrate 10 opposite to the upper surface supporting the plurality of upper pads 110. In addition, the plurality of lower pads 160 may include pads that are electrically connected to external devices.

In an example embodiment, the plurality of lower pads 160 may be arranged along a boundary of the lower surface of the insulating layer 100. The plurality of lower pads 160 may be provided at an edge portion of the insulating layer 100 to surround the central portion of the insulating layer 100.

In an example embodiment, an area formed by a lower surface of one of the plurality of lower pads 160 may be larger than an area formed by the upper surface of one of the plurality of upper pads 110. For example, if opposite surfaces of each of the lower pads 160 have a same size and opposite surfaces of each of the upper pads 110 have a same size, an area of a surface of a single lower pad 160 contacting the insulating layer 100 may be larger than an area of a surface of a single upper pad 110 contacting the insulating layer 100, e.g., an area of a surface contact between a single lower pad 160 and the insulating layer 100 may be larger than an area of a surface contact between a single 1 upper pad 110 and the insulating layer 100.

In addition, the total number of lower pads 160 may be smaller than the total number of upper pads 110. For example, the light emitting device substrate 10 may include eight lower pads 160 and twenty-four (24) upper pads 110.

At least one of the plurality of lower pads 160 may be electrically connected to two or more upper pads 110 via the first circuit pattern 120 and the second circuit pattern 140. For example, one lower pad 160, to which negative power is supplied, may be electrically connected to two or more upper pads 110 via the first circuit pattern 120 and the second circuit pattern 140. In addition, one lower pad 160, to which positive power is supplied, may be electrically connected to two or more upper pads 110 via the first circuit pattern 120 and the second circuit pattern 140.

The third conductive via 170 of the light emitting device substrate 10 may be connected to the plurality of lower pads 160 and the second circuit pattern 140. The third conductive via 170 may penetrate a portion of the insulating layer 100 in a vertical direction to contact the plurality of lower pads 160 and the second circuit pattern 140. For example, the third conductive via 170 may contact a portion of the upper surface of the plurality of lower pads 160 and a portion of the lower surface of the second circuit pattern 140. In an example embodiment, the third conductive via 170 may include a material that is substantially the same as that of the first circuit pattern 120, the second circuit pattern 140, the first conductive via 130, and the second conductive via 150.

Because the light emitting device substrate 10 includes the first circuit pattern 120 and the second circuit pattern 140, which electrically connect some of the plurality of upper pads 110 (which are spaced apart from each other on the upper surface of the insulating layer 100), the height of the connecting member (90 in FIG. 17) between the light emitting device chip (50 in FIG. 17) and the light emitting device substrate 10 may be increased. Accordingly, the bonding reliability of the light emitting device chip 50 and the light emitting device substrate 10 may be improved.

In addition, because the plurality of upper pads 110 of the light emitting device substrate 10 substantially have the same shape, size, and thickness, the height of the connecting member 90 between the light emitting device chip 50 and the light emitting device substrate 10 may also be substantially the same. Accordingly, tilting and rotation of the light emitting device chip 50 may be prevented.

Figure 3:
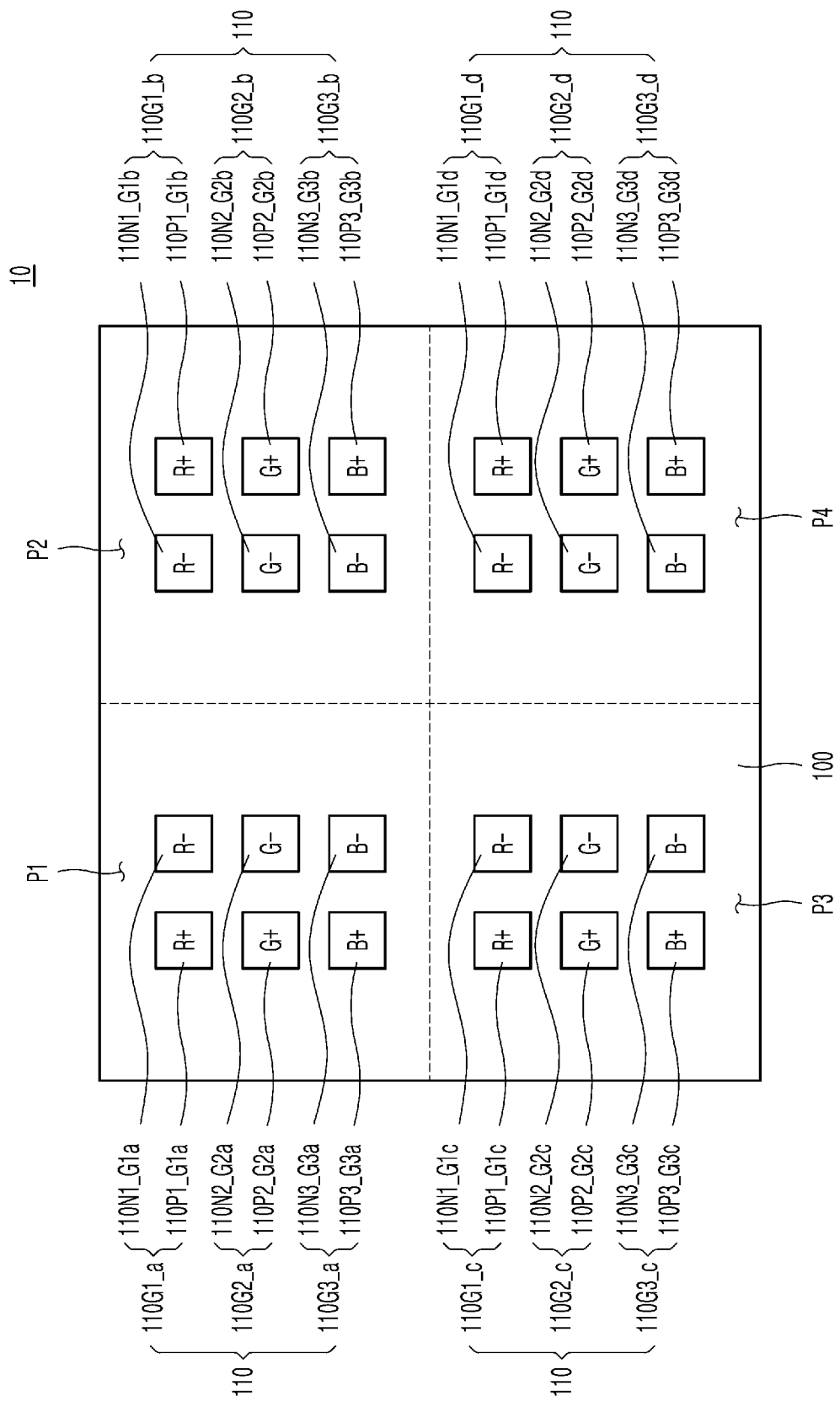
FIG. 3 is a plan view of a light emitting device substrate, according to an example embodiment.

FIG. 3 is a plan view of the light emitting device substrate 10, according to an example embodiment. FIG. 3 is a detailed plan view of the plurality of upper pads 110 on the insulating layer 100 with respect to emitted light.

Referring to FIG. 3, when the light emitting device substrate 10 defines an M*N matrix, the light emitting device substrate 10 may include M*N pixels P. If one pixel P includes six upper pads 110, the light emitting device substrate 10 with the M*N matrix includes 6*M*N upper pads 110. For example, one pixel P may include six upper pads 110 arranged in a 3*2 matrix. For example, when the light emitting device substrate 10 defines a 2*2 matrix, the light emitting device substrate 10 may include 4 pixels P, and may include twenty-four (24) upper pads 110.

In an example embodiment, the light emitting device substrate 10 may include first through fourth pixels P1 through P4. For example, the first pixel P1 may be a pixel at an upper left portion, the second pixel P2 may be a pixel at an upper right portion, the third pixel P3 may be a pixel at a lower left portion, and the fourth pixel P4 may be a pixel at a bottom right portion, e.g., as viewed in a top view of FIG. 3. The first through fourth pixels P1 through P4 may include first upper pad groups 110G1_a through 110G1_d, second upper pad groups 110G2_a through 110G2_d, and third upper pad groups 110G3_a through 110G3_d, respectively.

For example, the first upper pad group 110G1_a of the first pixel P1 may include a first anode upper pad 110P1_G1a and a first cathode upper pad 110N1_G1a. In addition, when the light emitting device substrate 10 is viewed from a planar perspective, the second upper pad group 110G2_a of the first pixel P1 may be apart from the first upper pad group 110G1_a in the vertical direction (of FIG. 3), and may include a second anode upper pad 110P2_G2a and a second cathode upper pad 110N2_G2a. In addition, when the light emitting device substrate 10 is viewed from the planar perspective, the third upper pad group 110G3_a of the first pixel P1 may be apart from the second upper pad group 110G2_a in the vertical direction (of FIG. 3), and may include a third anode upper pad 110P3_G3a and a third cathode upper pad 110N3_G3a.

In an example embodiment, the first through third upper pad groups 110G1_a through 110G3_a of the first pixel P1 may include a first light emitting device chip (50a in FIG. 17) and a second light emitting device chip (50b in FIG. 17), and a pad group for mounting a third light emitting device chip 50c. For example, the first light emitting device chip 50a, the second light emitting device chip 50b, and the third light emitting device chip 50c may include a red light emitting device chip, a green light emitting device chip, and a blue light emitting device chip, respectively.

For example, the first anode upper pad 110P1_G1a of the first upper pad group 110G1_a of the first pixel P1 may be electrically connected to an anode chip pad (520a in FIG. 18) among the chip pads (520 in FIG. 18) of the first light emitting device chip (50a in FIG. 17). In addition, the first cathode upper pad 110N1_G1a of the first upper pad group 110G1_a of the first pixel P1 may be apart from the first anode upper pad 110P1_G1a, and may be electrically connected to a cathode chip pad (520b in FIG. 18) among the chip pads 520 of the first light emitting device chip 50a.

The technical idea of the plurality of upper pads 110 in the second through fourth pixels P2 through P4 may be substantially the same as the technical idea of the plurality of upper pads 110 of the first pixel P1, and thus detailed descriptions thereof are omitted.

Figure 4:
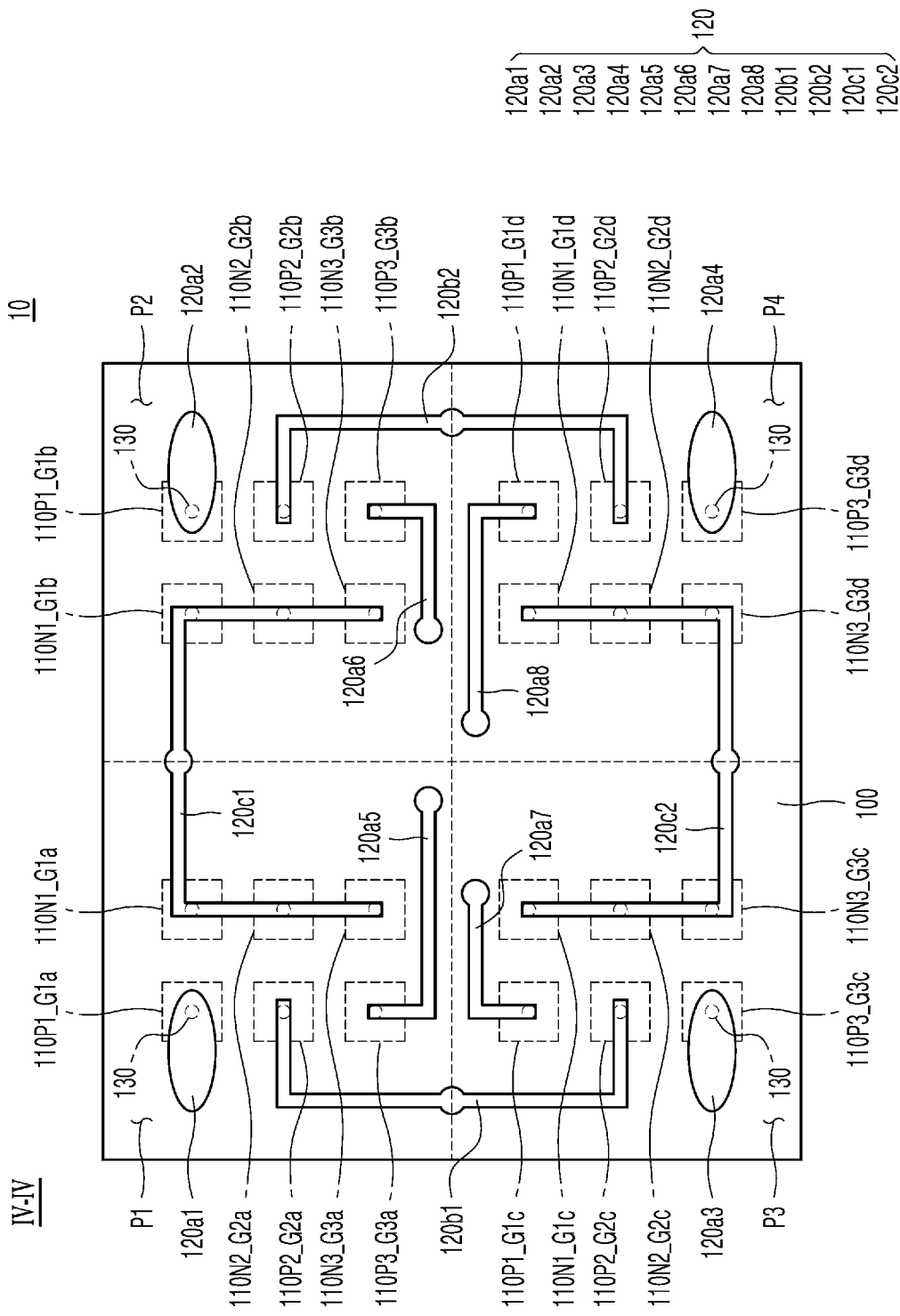
FIG. 4 is a cross-sectional view along line IV-IV in FIG. 2.

FIG. 4 is a cross-sectional view of line IV-IV in FIG. 2.

As illustrated in FIG. 2, in an example embodiment, the first circuit pattern 120 may be inside the insulating layer 100, and may electrically connect some of the plurality of upper pads 110. Referring to FIG. 4, the first circuit pattern 120 may include a plurality of, e.g., discrete, portions inside the insulating layer 100, with each portion of the first circuit pattern 120 being connected to different ones of the upper pads 110. For example, referring to FIGS. 3 and 4, some of circuit patterns 120a1 through 120a8 of the first circuit pattern 120 may be connected to one of the plurality of upper pads 110 via the first conductive via 130, and may not be connected to other upper pads 110.

In an example embodiment, the first light emitting device chip (50a in FIG. 17), the second light emitting device chip (50b in FIG. 17), and the third light emitting device chip (50c in FIG. 17) may be mounted on the first upper pad groups 110G1_a through 110G1_d, the second upper pad groups 110G2_a through 110G2_d, and the third upper pad groups 110G3_a through 110G3_d, respectively. In an example embodiment, some of the circuit patterns 120b1 and 120b2 of the first circuit pattern 120 may be electrically connected to the upper pads of the same electrode among the upper pads 110 having the light emitting device chip emitting the same color mounted thereon.

In an example embodiment, some of the circuit patterns 120b1 of the first circuit pattern 120 may electrically connect the second anode upper pad 110P2_G2a of the second upper pad group 110G2_a of the first pixel P1 to the second anode upper pad 110P2_G2c of the second upper pad group 110G2_c of the third pixel P3. In addition, some of the circuit patterns 120b2 among the first circuit pattern 120 may electrically connect the second anode upper pad 110P2_G2b of the second upper pad group 110G2_b of the second pixel P2 to the second anode upper pad 110P2_G2d of the second upper pad group 110G2_d of the fourth pixel P4. However, a structure in which some of the first circuit patterns 120 connect the upper pads 110 to each other is not limited thereto.

In addition, in an example embodiment, some of the circuit patterns 120c1 and 120c2 of the first circuit pattern 120 may electrically connect the upper pads of the same electrode among the upper pads 110 having the light emitting device chip emitting the same color mounted thereon to each other. For example, some of the circuit patterns 120c1 among the first circuit pattern 120 may electrically connect the first, second, and third cathode upper pads 110N1_G1a, 110N2_G2a, 110N3_G3a of the first pixel P1 to the first, second, and third cathode upper pads 110N1_G1b, 110N2_G2b, and 110N3_G3b of the second pixel P2. In addition, some of the circuit patterns 120c2 among the first circuit pattern 120 may electrically connect the first, second, and third cathode upper pads 110N1_G1c, 110N2_G2c, 110N3_G3c of the third pixel P3 to the first, second, and third cathode upper pads 110N1_G1d, 110N2_G2d, and 110N3_G3d of the fourth pixel P4. However, a structure in which some of the first circuit patterns 120 connect the upper pads 110 is not limited thereto.

In an example embodiment, the plurality of upper pads 110 and the first circuit pattern 120 may be electrically connected to each other via the first conductive via 130.

Figure 5:
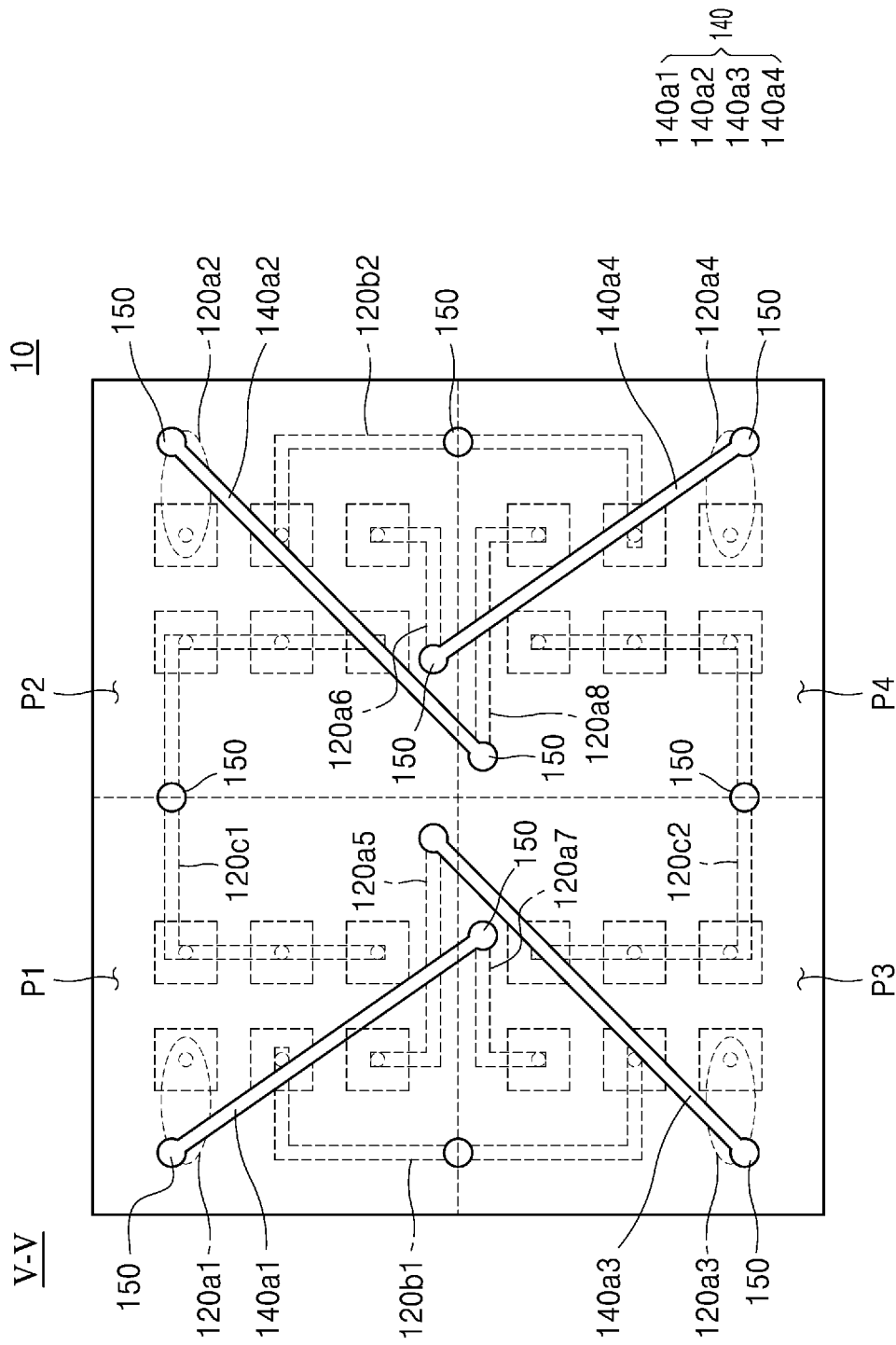
FIG. 5 is a cross-sectional view along line V-V in FIG. 2.

FIG. 5 is a cross-sectional view of line V-V in FIG. 2.

Referring to FIG. 5, the second circuit pattern 140 may be inside the insulating layer 100, and may electrically connect some of the first circuit patterns 120. For example, the second circuit pattern 140 may include a plurality of, e.g., discrete, portions inside the insulating layer 100, with each portion of the second circuit pattern 140 being connected to different ones of the portions of the first circuit pattern 120.

Some circuit patterns 140a1 through 140a4 of the second circuit pattern 140 may electrically connect second conductive vias 150 to each other. In an example embodiment, some of the circuit patterns 140a1 through 140a4 of the second circuit pattern 140 may be connected to the plurality of second conductive vias 150, so that the upper pads of the same electrodes among the upper pads 110 having the light emitting device chip emitting the same color mounted thereon are electrically connected to each other.

For example, some of the circuit patterns 140a1 among the second circuit patterns 140 may be connected to the plurality of second conductive vias 150, so that the first anode upper pad 110P1_G1a of the first upper pad group 110G1_a of the first pixel P1 are connected to the first anode upper pad 110P1_G1c of the first upper pad group 110G1_c of the third pixels P3. For example, some of the circuit patterns 140a3 among the second circuit pattern 140 may be connected to the plurality of second conductive vias 150, so that the third anode upper pads 110P3_G3a of the third upper pad group 110G3_a of the first pixel P1 are electrically connected to the third anode upper pad 110P3_G3c of the third upper pad group 110G3_c of the third pixels P3.

In an example embodiment, the second circuit pattern 140 may extend to a portion adjacent to the edge portion of the light emitting device substrate 10. Accordingly, the third conductive via 170 connected to the second circuit pattern 140 may be formed at the edge portion of the light emitting device substrate 10, and the plurality of lower pads 160 may also be formed on the edge portion of the light emitting device substrate 10.

Figure 6:
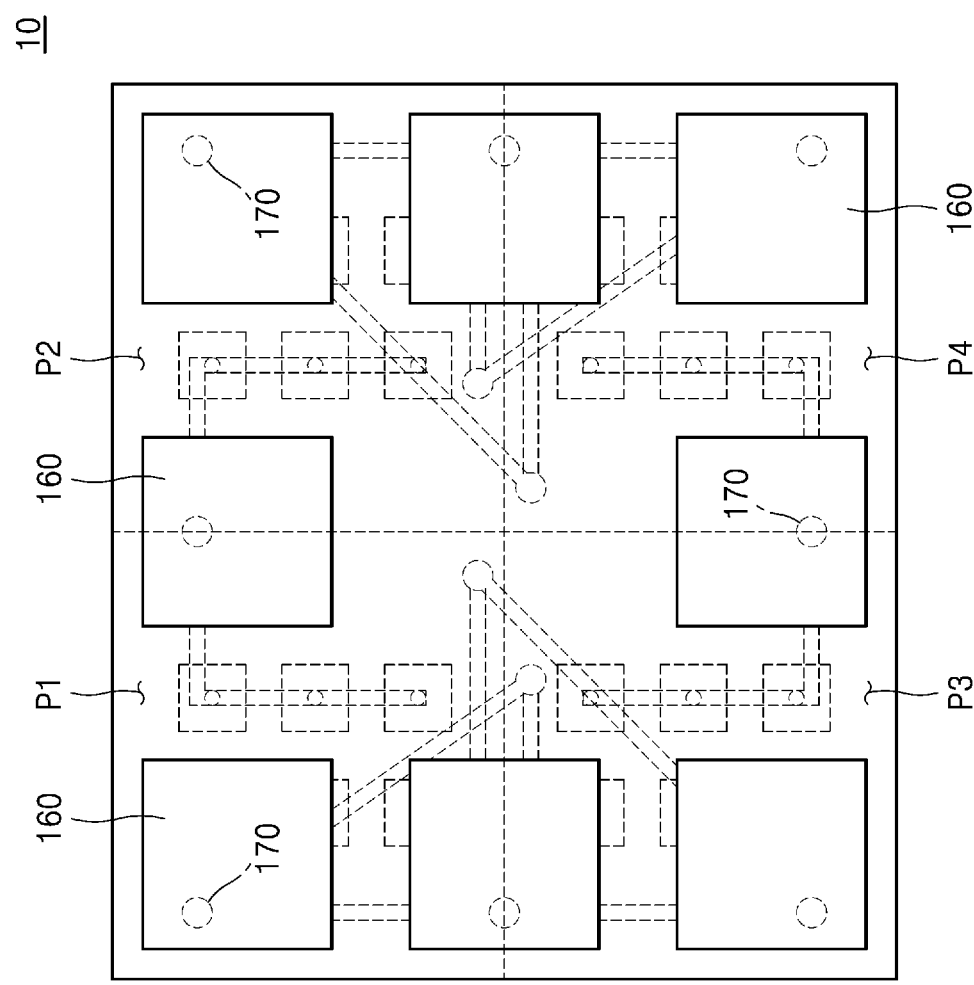
FIG. 6 is a bottom side view of a light emitting device substrate, according to an example embodiment.

FIG. 6 is a bottom surface view of the light emitting device substrate 10, according to an example embodiment.

Referring to FIG. 6, when the light emitting device substrate 10 defines the M*N matrix, the light emitting device substrate 10 may include 3*M+N lower pads 160. The plurality of lower pads 160 may be electrically connected to the second circuit pattern 140 via the third conductive via 170. For example, as illustrated in FIG. 6, when the light emitting device substrate 10 defines a 2*2 matrix, the light emitting device substrate 10 may include 4 pixels P, and may include 8 lower pads 160.

The plurality of lower pads 160 may be provided at an edge portion of the insulating layer 100 to surround the central portion of the insulating layer 100. In addition, an area formed by a lower surface of one of the plurality of lower pads 160 may be larger than an area formed by the upper surface of one of the plurality of upper pads 110.

In addition, the total number of lower pads 160 may be less than the total number of upper pads 110. When the light emitting device substrate 10 defines an M*N matrix, 3*M+N, which is the total number of lower pads 160, may be less than 6*M*N, which is the total number of upper pads 110. (In other words, 3*M+N<6*M*N).

Figure 7:
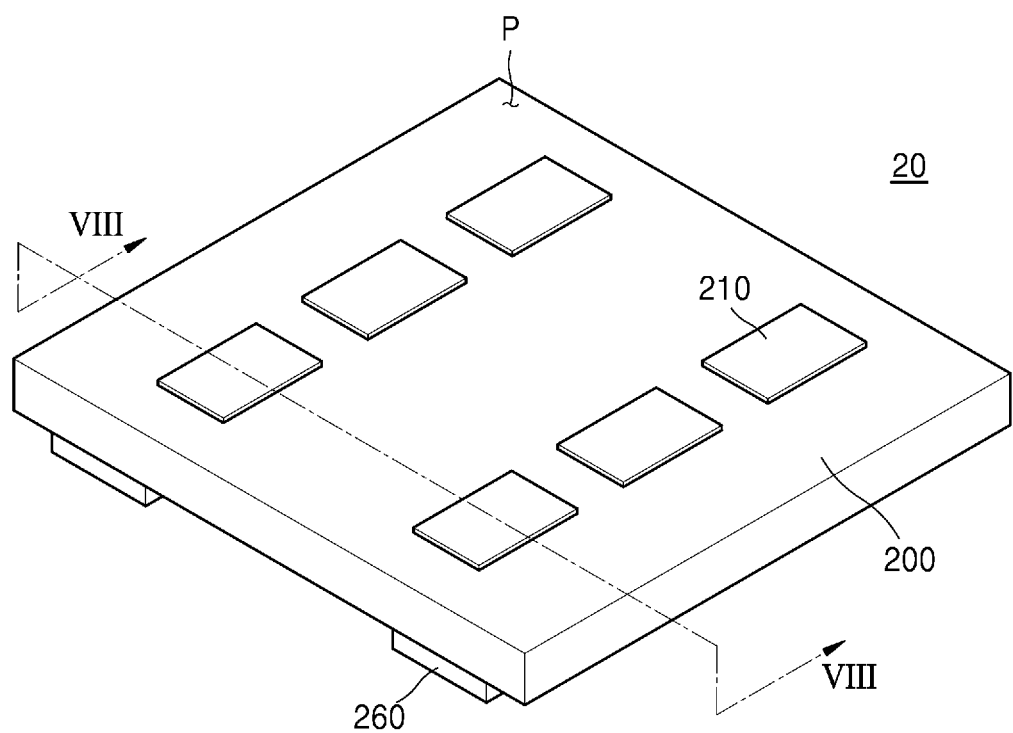
FIG. 7 is a perspective view of a light emitting device substrate, according to an example embodiment.
Figure 8:
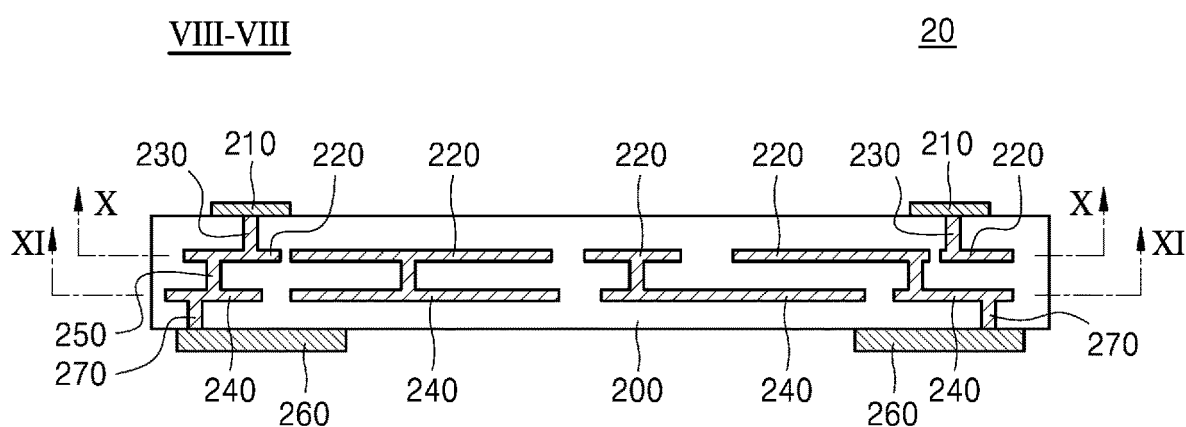
FIG. 8 is a cross-sectional view along line VIII-VIII in FIG. 7.

FIG. 7 is a perspective view of a light emitting device substrate 20, according to an example embodiment. FIG. 8 is a cross-sectional view of line VIII-VIII in FIG. 7. The light emitting device substrate 20 may include a substrate for mounting a light emitting device chip (50 in FIG. 17) thereon.

Referring to FIGS. 7 and 8, the light emitting device substrate 20 may include an insulating layer 200, a plurality of upper pads 210, a first circuit pattern 220, a first conductive via 230, a second circuit pattern 240, a second conductive via 250, a plurality of lower pads 260, a third conductive via 270, etc. Because the technical idea of the light emitting device substrate 20 of FIGS. 7 and 8 may be substantially the same as the light emitting device substrate 10 of FIGS. 1 and 2, duplicate descriptions thereof are omitted.

In an example embodiment, the light emitting device substrate 20 may define a 1*1 matrix including one row and one column. Accordingly, the light emitting device substrate 20 may have one pixel P.

Figure 9:
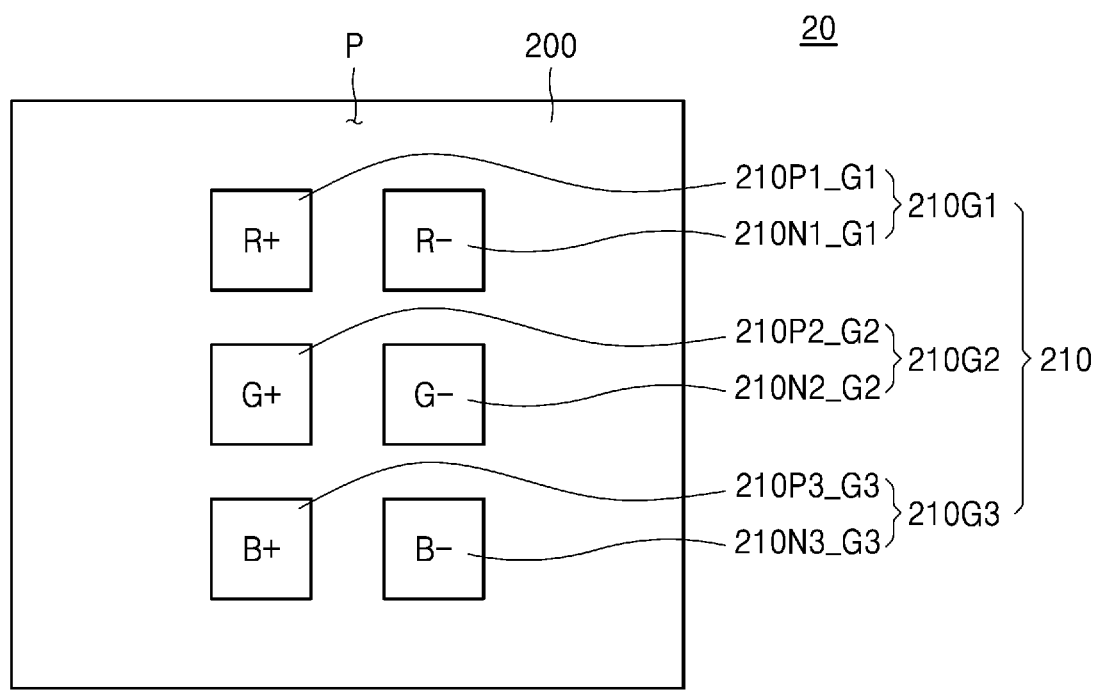
FIG. 9 is a plan view of a light emitting device substrate, according to an example embodiment.

FIG. 9 is a plan view of the light emitting device substrate 20, according to an example embodiment.

Referring to FIG. 9, the light emitting device substrate 20 may include one pixel P, and the pixel P may include 6 upper pads 210. For example, one pixel P may include six upper pads 210 arranged in a 3*2 matrix.

In an example embodiment, the pixel P may include first through third upper pad groups 210G1 through 210G3. The first through third upper pad groups 210G1 through 210G3 may include first through third anode upper pads 210P1_G1 through 210P1_G3 and first through third cathode upper pads 210N1_G1 through 210N3_G3, respectively.

In an example embodiment, the first through third upper pad groups 210G1 through 210G3 of the pixel P may include pad groups to mount the first light emitting device chip 50a, the second light emitting device chip 50b, and the third light emitting device chip 50c thereon, respectively. For example, the first light emitting device chip 50a, the second light emitting device chip 50b, and the third light emitting device chip 50c may include a red light emitting device chip, a green light emitting device chip, and a blue light emitting device chip, respectively.

Figure 10:
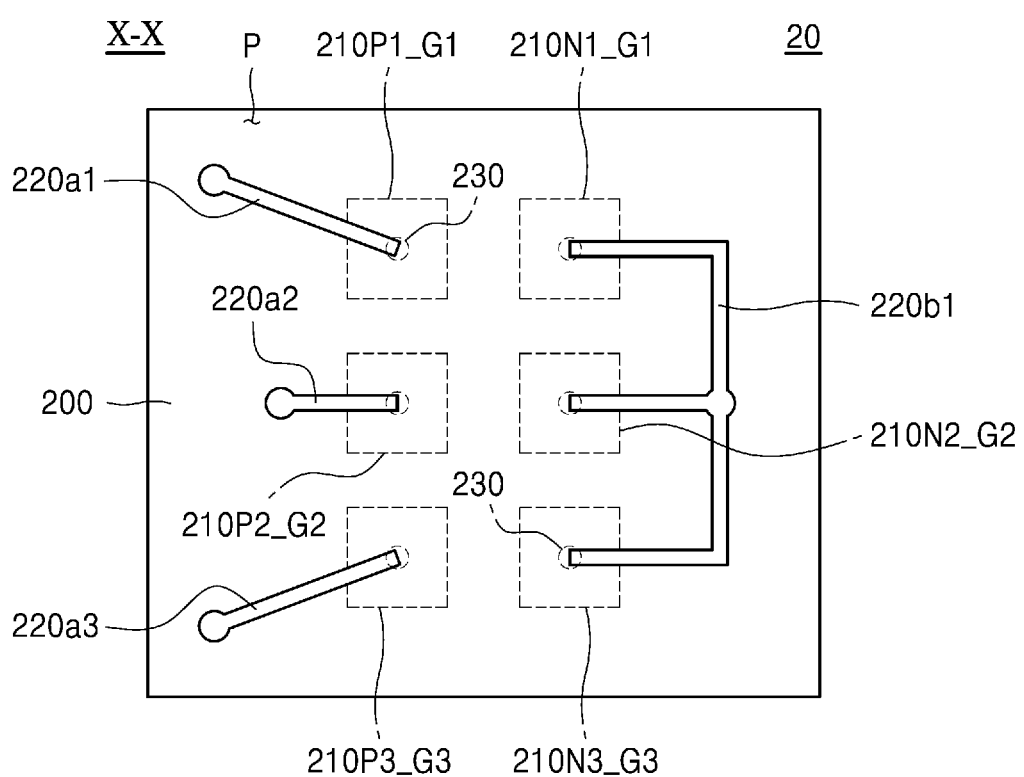
FIG. 10 is a cross-sectional view along line X-X in FIG. 8.

FIG. 10 is a cross-sectional view of line X-X in FIG. 8. Referring to FIG. 10, some of circuit patterns 220a1 through 220a3 of the first circuit pattern 220 may be connected to one upper pad of the plurality of upper pads 210 via the first conductive via 230, and may not be connected to other upper pads than the one upper pad. In addition, in an example embodiment, some of the circuit patterns 220b1 of the first circuit pattern 220 may electrically connect the upper pads of the same electrode among the upper pads 110 having the light emitting device chip emitting the same color mounted thereon to each other.

In an example embodiment, some of the circuit patterns 220b1 of the first circuit patterns 220 may electrically connect the first through third cathode upper pads 110N1_G1 through 110N3_G3 of the pixel P to each other. However, a structure in which some of the first circuit pattern 220 is connected to the upper pads 210 is not limited thereto.

Figure 11:
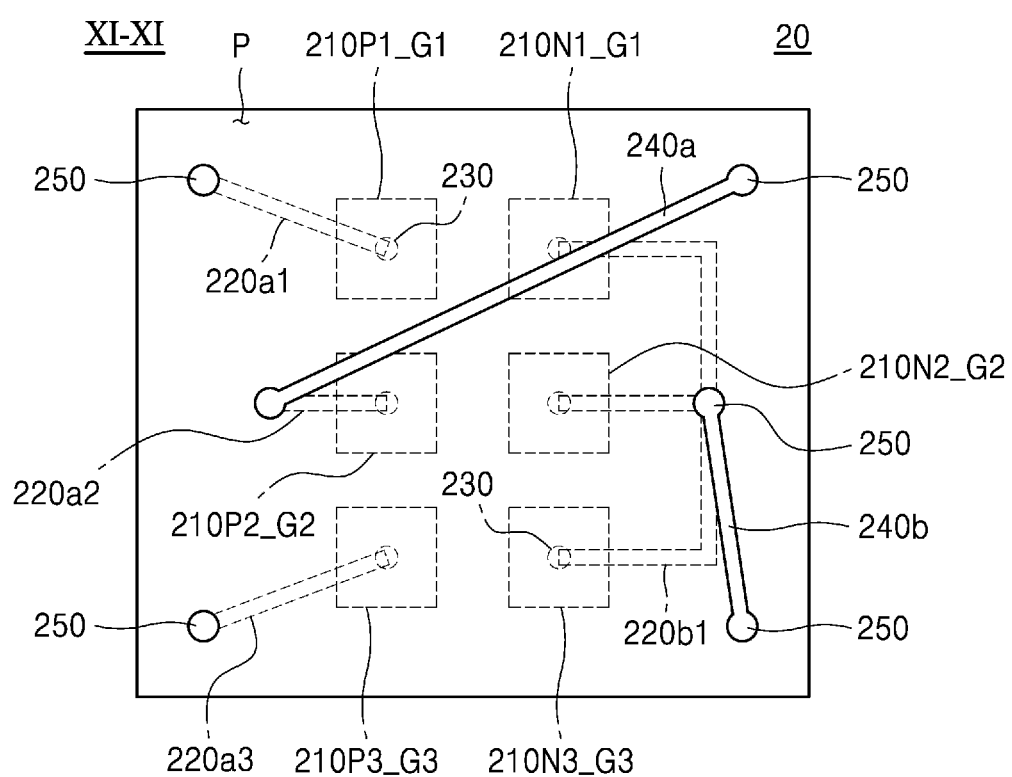
FIG. 11 is a cross-sectional view along line XI-XI in FIG. 8.

FIG. 11 is a cross-sectional view of line XI-XI in FIG. 8. Referring to FIG. 11, the second circuit pattern 240 may be under the first circuit pattern 120 in the insulating layer 200, and may be electrically connected to some of the first circuit patterns 220 via the second conductive via 250.

In an example embodiment, the second circuit pattern 240 may extend to a portion adjacent to the edge portion of the light emitting device substrate 20. Accordingly, the third conductive via 270 connected to the second circuit pattern 240 may be formed at the edge portion of the light emitting device substrate 20, and the plurality of lower pads 260 may also be formed on the edge portion of the light emitting device substrate 20.

For example, some of the circuit patterns 240a of the second circuit pattern 240 may be connected to the second anode upper pads 110P2_G2, and extend to the upper right portion of the light emitting device substrate 20. In addition, some of the circuit patterns 240b of the second circuit pattern 240 may be electrically connected to some of the circuit patterns 220b1 of the first circuit pattern 220 in which the upper pads of the same electrode are electrically connected, and may extend to the lower right portion of the light emitting device substrate 20. However, a structure in which some of the second circuit patterns 240 are connected to the upper pads 210 is not limited thereto.

Figure 12:
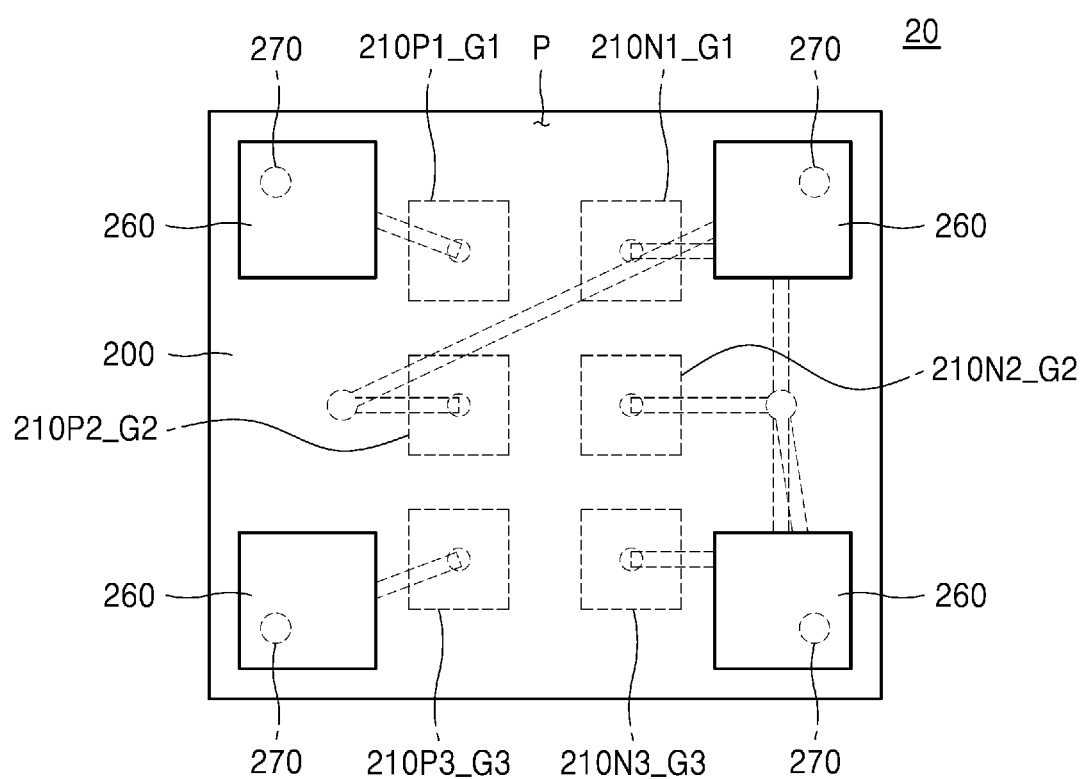
FIG. 12 is a bottom side view of a light emitting device substrate, according to an example embodiment.

FIG. 12 is a bottom surface view of the light emitting device substrate 20, according to an example embodiment.

Referring to FIG. 12, the light emitting device substrate 20 may include the 1*1 matrix, and include 4 lower pads 260. In addition, the total number of lower pads 260 may have a smaller number than the total number of the upper pads 210. When the light emitting device substrate 20 has the 1*1 matrix having one pixel P, the number of lower pads 260 may be 4, and the number of upper pads 210 may be 6.

In an example embodiment, the plurality of lower pads 260 may be arranged at an edge portion of the insulating layer 200, e.g., at corners, to surround the central portion of the insulating layer 200. In addition, an area formed by a lower surface of one of the plurality of lower pads 260 may be larger than an area formed by the upper surface of one of the plurality of upper pads 210.

Figure 13:
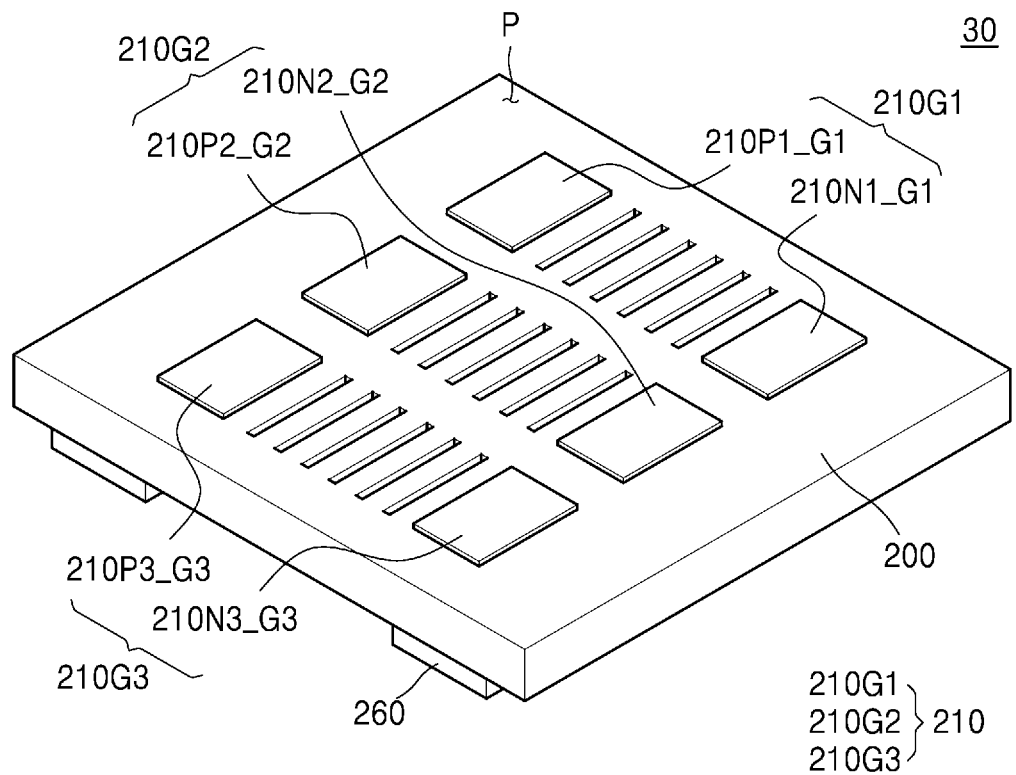
FIG. 13 is a perspective view of a light emitting device substrate, according to an example embodiment.

FIG. 13 is a perspective view of a light emitting device substrate 30, according to an example embodiment. In an example embodiment, the light emitting device substrate 30 may define the M*N matrix. For convenience of description, FIG. 13 illustrates the light emitting device substrates 30 of the 1*1 matrix, but is not limited thereto, and the light emitting device substrate 30 may define a matrix of M (2 or more) rows and N (2 or more) columns.

Referring to FIG. 13, the light emitting device substrate 30 may include an insulating layer 200, a plurality of upper pads 210, a first circuit pattern 220, a first conductive via 230, a second circuit pattern 240, a second conductive via 250, a plurality of lower pads 260, a third conductive via 270, etc. Because the technical idea of the light emitting device substrate 30 is substantially the same as the light emitting device substrates 10 and 20 described above, duplicated descriptions thereof are omitted.

In the example embodiment, as described above, the pixel P may include the first upper pad group 210G1 including the first anode upper pad 210P1_G1 and the first cathode upper pad 210N1_G1, the second upper pad group 210G2 including the second anode upper pad 210P2_G2 and the second cathode upper pad 210N2_G2, and the third upper pad group 210G3 including the third anode upper pad 210P3_G3 and the third cathode upper pad 210N3_G3.

In the case of a general light emitting device substrate, a gap between the first anode upper pad 210P1_G1 and the first cathode upper pad 210N1_G1, a gap between the second anode upper pad 210P2_G2 and the second cathode upper pad 210N2_G2, and a gap between the third anode upper pad 210P3_G3 and the third cathode upper pad 210N3_G3 may be relatively narrow for convenience of mounting of the light emitting device chips (50a through 50c in FIG. 17).

When the light emitting device chips 50a through 50c are mounted and operated on a general light emitting device substrate, some of the plurality of upper pads 210 including a metal material may be ionized, and the ions may be moved from the first through third cathode upper pads 210N1_G1 through 210N3_G3 to the first through third anode upper pads 210P1_G1 through 210P3_G3. An ionic-migration effect may cause malfunction of the light emitting device chips 50a through 50c.

To reduce the ionic-migration effect described above, the light emitting device substrate 30 may have a structure in which a pathway of ions is increased. Hereinafter, the structure of the light emitting device substrate 30 in which the pathway of ions is increased is described in more detail.

In an example embodiment, the insulating layer 200 of the light emitting device substrate 30 may have an uneven structure in which concaveness and convexity are repeated in at least one of a portion between the first anode upper pad 210P1_G1 and the first cathode upper pad 210N1_G1, a portion between the second anode upper pad 210P2_G2 and the second cathode upper pad 210N2_G2, and a portion between the third anode upper pad 210P3_G3 and the third cathode upper pad 210N3_G3.

Because the light emitting device substrate 30 includes the insulating layer 200 having a concavo-convex structure shape between the first, second, and third anode upper pads 210P1_G1 through 210P3_G3 and the first, second, and third cathode upper pads 210N1_G1 through 210N3_G3, the pathway of ions may be increased and the ionic-migration effect may be suppressed. Accordingly, malfunctions of the light emitting device chips 50a through 50c may be reduced.

Figure 14:
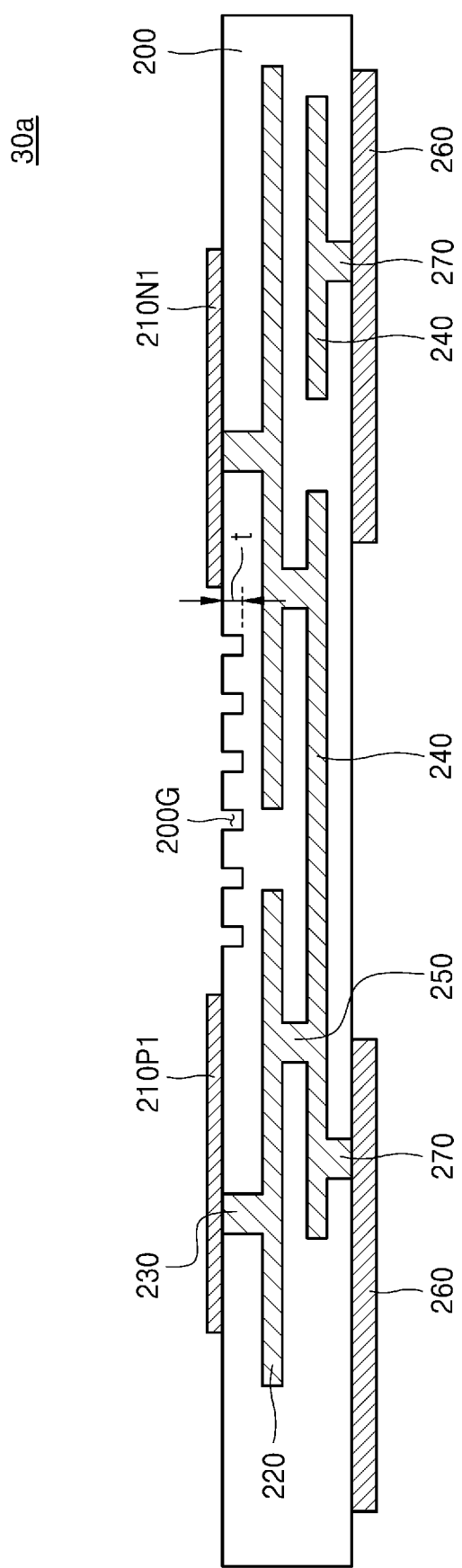
FIGS. 14 and 15 are cross-sectional views of light emitting device substrates, according to example embodiments.
Figure 15:
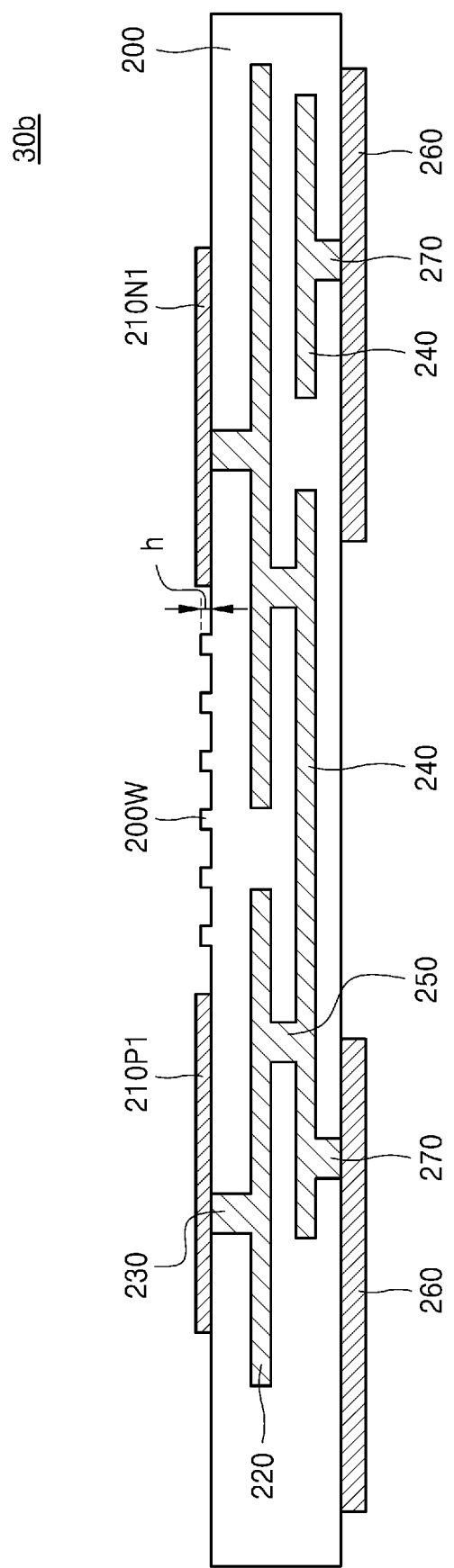

FIGS. 14 and 15 are cross-sectional views of light emitting device substrates 30a and 30b, according to example embodiments, respectively.

Referring to FIG. 14, the insulating layer 200 of the light emitting device substrate 30a may include a plurality of grooves 200G in a portion between an anode upper pad 210P1 and a cathode upper pad 210N1. The plurality of grooves 200G may be formed by etching a portion of the insulating layer 200 between the first anode upper pad 210P1_G1 and the first cathode upper pad 210N1_G1, a portion of the insulating layer 200 between the second anode upper pad 210P2_G2 and the second cathode upper pads 210N2_G2, and a portion of the insulating layer 200 between the third anode upper pads 210P3_G3 and the third cathode upper pads 210N3_G3.

In an example embodiment, the plurality of grooves 200G may be formed by a process such as a reactive ion etching (RIE) process using plasma, a laser drilling process, or the like. In an example embodiment, a depth t of the plurality of grooves 200G may be about 5 micrometers to about 20 micrometers. For example, the depth t of the plurality of grooves 200G may be about 15 micrometers. However, the depth t of the plurality of grooves 200G is not limited thereto.

Referring to FIG. 15, the light emitting device substrate 30b may include a plurality of walls 200W protruding upward from the upper surface of the insulating layer 200 in a portion between the anode upper pad 210P1 and the cathode upper pad 210N1. The plurality of walls 200W may have a shape protruding upward from a portion of the insulating layer 200 between the first anode upper pad 210P1_G1 and the first cathode upper pad 210N1_G1, a portion of the insulating layer 200 between the second anode upper pad 210P2_G2 and the second cathode upper pads 210N2_G2, and a portion of the insulating layer 200 between the third anode upper pads 210P3_G3 and the third cathode upper pads 210N3_G3.

In an example embodiment, a height h of the plurality of walls 200W may be about 5 micrometers to about 20 micrometers. For example, the height h of the plurality of walls 200W may be about 15 micrometers. However, the height h of the plurality of walls 200W is not limited thereto.

In an example embodiment, the height of the plurality of walls 200W may be less than the height of the plurality of upper pads 110. In other words, the upper surface of the plurality of walls 200W may be at a lower level than the upper surface of the plurality of upper pads 210. The level may be defined as a length formed in the vertical direction from the upper surface of the insulating layer 200. Because the upper surface of the plurality of walls 200W is at a lower level than the upper surface of the plurality of upper pads 210, the plurality of walls 200W may not interfere with the light emitting device chips 50a through 50c mounted on the plurality of upper pads 210.

Figure 16:
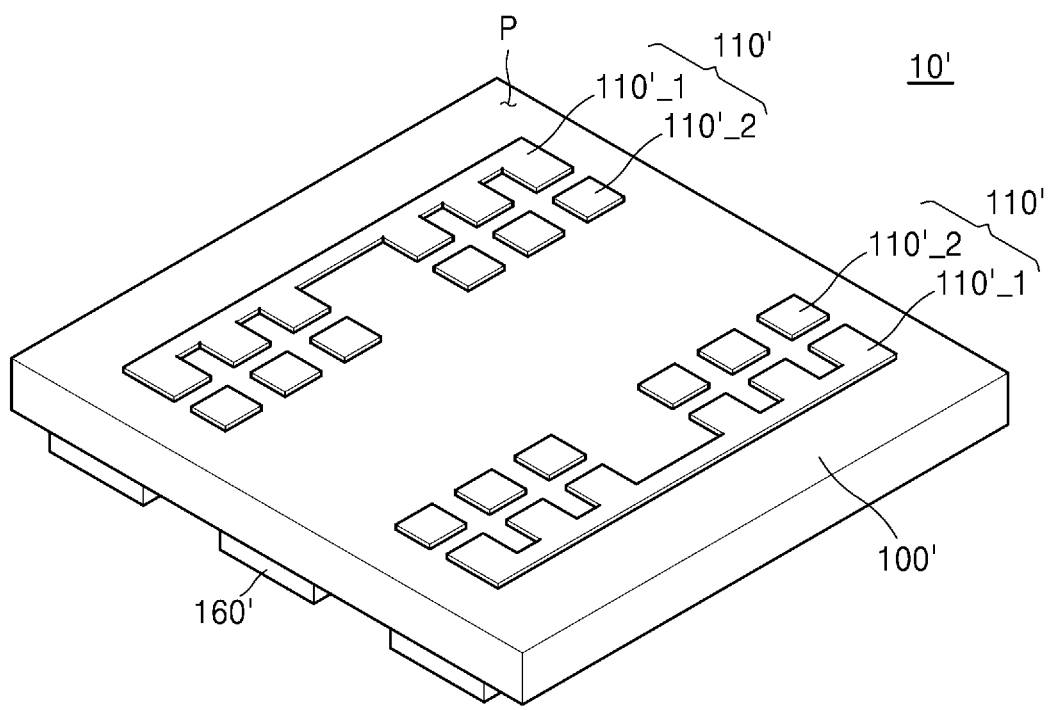
FIG. 16 is a perspective view of a light emitting device according to a comparison example.

FIG. 16 is a perspective view of a light emitting device substrate 10' according to a comparison example.

Referring to FIG. 16, the light emitting device substrate 10' according to the comparative example may include an insulating layer 100' and a plurality of upper pads 110' mounted on the insulating layer 100'. The plurality of upper pads 110' may include first upper pads 110'_1 and second upper pads 110'_2. The first upper pads 110'_1 and the second upper pads 110'_2 may have different sizes and shapes. For example, the size and area of the first upper pads 110'_1 may be greater than the size and shape of the second upper pads 110'_2. In addition, an area of an upper surface of the first upper pads 110'_1 may be greater than an area of an upper surface of the second upper pads 110'_2.

The first upper pads 110'_1 may mount the light emitting device chips (50a through 50c in FIG. 17) emitting different colors among the plurality of upper pads 110' thereon, but may have a structure in which upper pads, which are mutually identical electrodes, are interconnected. For example, the first upper pads 110'_1 may be pads that electrically connect the pads of the anode among the pads on which a red light emitting device chip, a green light emitting device chip, and a blue light emitting device chip are mounted.

The first upper pads 110'_1 may be provided on the insulating layer 100 with a different size and shape from the second upper pads 110'_2, and accordingly, a height of the connecting member (90 in FIG. 17) on the first upper pads 110'_1 may be less than a height formed by the connecting member 90 on the second upper pads 110'_2. In other words, during a reflow process of the connecting member 90, the connecting member 90 may flow on the first upper pads 110'_1 and the second upper pads 110'_2. A difference in the height between the connecting members 90 may occur due to a difference in the area of the upper surfaces of the first upper pads 110'_1 and the second upper pads 110' 2.

Due to the difference in the height of the connecting member 90 on the light emitting device substrate 10', the light emitting device chips 50 mounted on the light emitting device substrate 10' may be inclined. In addition, the light emitting device chips 50 mounted on the light emitting device substrate 10' may be rotated.

In addition, because the first upper pads 110'_1 have the upper surface of a relatively large area, the height of the connecting member 90 on the first upper pads 110' may be small. For example, the connecting member 90 on the first upper pads 110'_1 may have a height of about 5 micrometers to about 10 micrometers. Because the height of the connecting member 90 on the light emitting device substrate 10' according to the comparative example is small, the bonding reliability between the light emitting device chip 50 and the light emitting device substrate 10' may be low.

Figure 18:
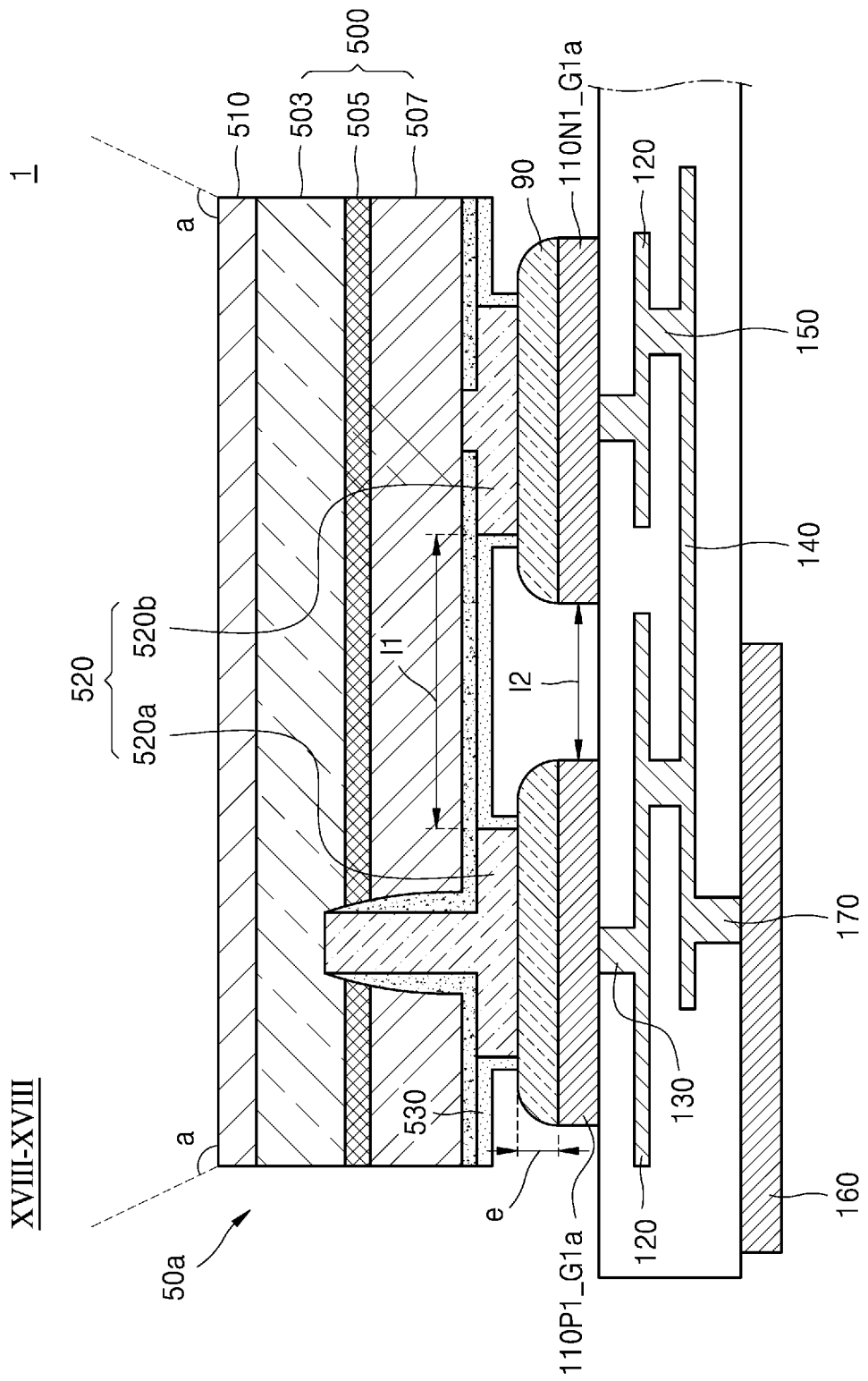
FIG. 18 is a cross-sectional view along line XVIII-XVIII in FIG. 17.

FIG. 17 is a perspective view of a light emitting device package 1, according to an example embodiment. FIG. 18 is a cross-sectional view along line XVIII-XVIII in FIG. 17.

Referring to FIGS. 17 and 18, the light emitting device package 1 may include the light emitting device substrate 10, the plurality of light emitting device chips 50, and the connecting member 90. The technical idea of the light emitting device substrate 10 may be substantially the same as that described with reference to FIG. 1.

The plurality of light emitting device chips 50 may include a semiconductor chip emitting light based on an electrical signal. In an example embodiment, the plurality of light emitting device chips 50 may include the first, second, and third light emitting device chips 50a, 50b, and 50c. The first, second, and third light emitting device chips 50a, 50b, and 50c may include the red light emitting device chip, the green light emitting device chip, and the blue light emitting device chip, respectively.

The plurality of light emitting device chips 50 may each include a light emitting structure 500, a light transmissive material layer 510, a chip pad 520, and an insulating layer 530, respectively. In an example embodiment, the light emitting structure 500 may have a structure in which a first conductivity type semiconductor layer 503, an active layer 505, and a second conductivity type semiconductor layer 507 are stacked. The first conductivity type semiconductor layer 503 and the second conductivity type semiconductor layer 507 may include semiconductors doped with p-type and n-type impurities, respectively.

In addition, the active layer 505 may include a layer that is between the first conductivity type semiconductor layer 503 and the second conductivity type semiconductor layer 507, and emits light having a certain energy by combining electrons and holes. The active layer 505 may emit blue light, green light, red light, ultraviolet light, or the like depending on a material of a compound semiconductor constituting the light emitting structure 500.

In an example embodiment, the active layer 505 may have a multi-quantum well (MQW) structure in which quantum well layers and quantum barrier layers are alternately stacked, e.g., an InGaN/GaN or AlGaN/GaN structure. However, embodiments are not limited thereto, and the active layer 505 may have a single quantum well (SQW) structure.

The light transmissive material layer 510 is on the light emitting structure 500, and may include at least one of a transmissive wavelength conversion layer and a lens layer. For example, the wavelength conversion layer may include a layer converting at least some of the light to light of a different wavelength by being excited by light emitted from the light emitting structure 500. In addition, the lens layer may include a layer having various structures capable of changing an orientation angle a, like a convex lens or a concave lens.

The chip pad 520 may include an anode chip pad 520a and a cathode chip pad 520b. In an example embodiment, the anode chip pad 520a and the cathode chip pad 520b may be connected to the first conductivity type semiconductor layer 503 and the second conductivity type semiconductor layer 507, respectively.

In an example embodiment, the insulating layer 530 may prevent electrical connection between the anode chip pad 520a, and the active layer 505, and the cathode chip pad 520b. The anode chip pad 520a may be connected to the first conductivity type semiconductor layer 503 in a space limited by the insulating layer 530. In addition, the cathode chip pad 520b may penetrate the insulating layer 530 covering the second conductivity type semiconductor layer 507 and be connected to the second conductivity type semiconductor layer 507.

The connecting member 90 may be between the chip pad 520 of the light emitting device chip 50 and the upper pads 110, and electrically connect the light emitting device chip 50 to the light emitting device substrate 10. For example, the connecting member 90 may be a solder ball including a conductive material.

As described above, the plurality of upper pads 110, e.g., pads 110P1_G1a and 110N1_G1a in FIG. 18, may be apart from each other without being interconnected on the upper surface of the insulating layer 100. In addition, the plurality of upper pads 110 may have substantially the same shape, size, and thickness. For example, each of the plurality of upper pads 110 may have a cuboid shape having substantially the same size and thickness.

In an example embodiment, in a plan view of the light emitting device substrate 10, the plurality of upper pads 110 may be arranged on the insulating layer 100 in a similar shape to a plurality of islands of the same shape and size having a certain pattern in the sea. The plurality of upper pads 110 may be apart from each other with substantially the same shape, size, and thickness, and thus the connecting member 90 on the first anode upper pad 110P1_G1a and the first cathode upper pad 110N1_G1a may have substantially the same shape, size, and height. Accordingly, the tilting and rotation of the light emitting device chip 50 mounted on the upper pads 110 may be prevented.

In addition, because the upper pads 110 of the light emitting device substrate 10 are provided in a smaller size than the first upper pads 110'_1 of the light emitting device substrate 10 for mounting the light emitting device according to the comparative example of FIG. 16, the connecting member 90 may have a relatively large height.

In an example embodiment, the area formed by the upper surface of the upper pads 110 may be about 1.0 to about 4.5 times the area formed by the lower surface of one chip pad 520 of the light emitting device chip 50. In an example embodiment, when the area of the upper surface of each of the plurality of upper pads 110 is less than about 1.0 times the area of the chip pad 520 of the light emitting device chip 50, the inclination of the light emitting device chip 50 may be increased. In addition, when the area of the upper surface of each of the plurality of upper pads 110 exceeds about 4.5 times the area of the chip pad 520 of the light emitting device chip 50, the rotation of the light emitting device chip 50 may be increased.

When the upper surface of the upper pads 110 is about 1.0 to about 4.5 times the area formed by the lower surface of the chip pad 520, a height e formed by the connecting member 90 may be about 10 micrometers. The height e formed by the connecting member 90 may be about 10 micrometers to about 20 micrometers.

In an example embodiment, a separation distance 12 between the first anode upper pad 110P1_G1a and the first cathode upper pad 110N1_G1a may be less than a separation distance 11 between the anode chip pad 520a and the cathode chip pad 520b of the chip pad 520. For example, the separation distance 12 between the first anode upper pad 110P1_G1a and the first cathode upper pad 110N1_G1a may be about 0.25 to about 0.50 times the separation distance 11 between the anode chip pad 520a and the cathode chip pad 520b of the chip pad 520. Accordingly, the light emitting device chip 50 may be easily mounted on the light emitting device substrate 10.

In addition, the plurality of lower pads 160 may be provided along the boundary of the lower surface of the insulating layer 100 so that the central portion of the insulating layer 100 is surrounded. Accordingly, it may be possible to easily check and repair defects in connection of the plurality of lower pads 160 to an external device.

Figure 19:
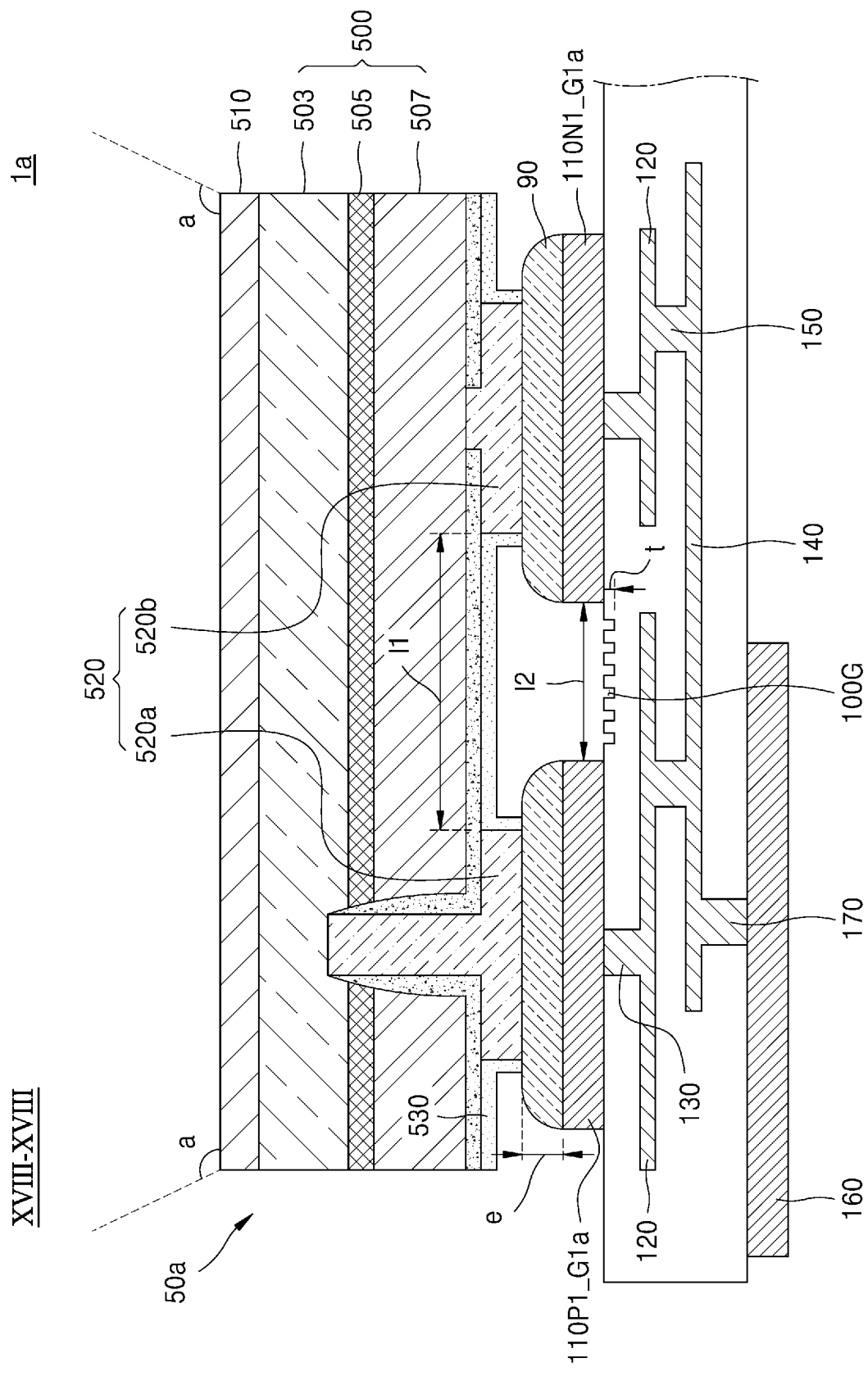
FIGS. 19 and 20 are cross-sectional views of light emitting device packages, according to example embodiments.
Figure 20:
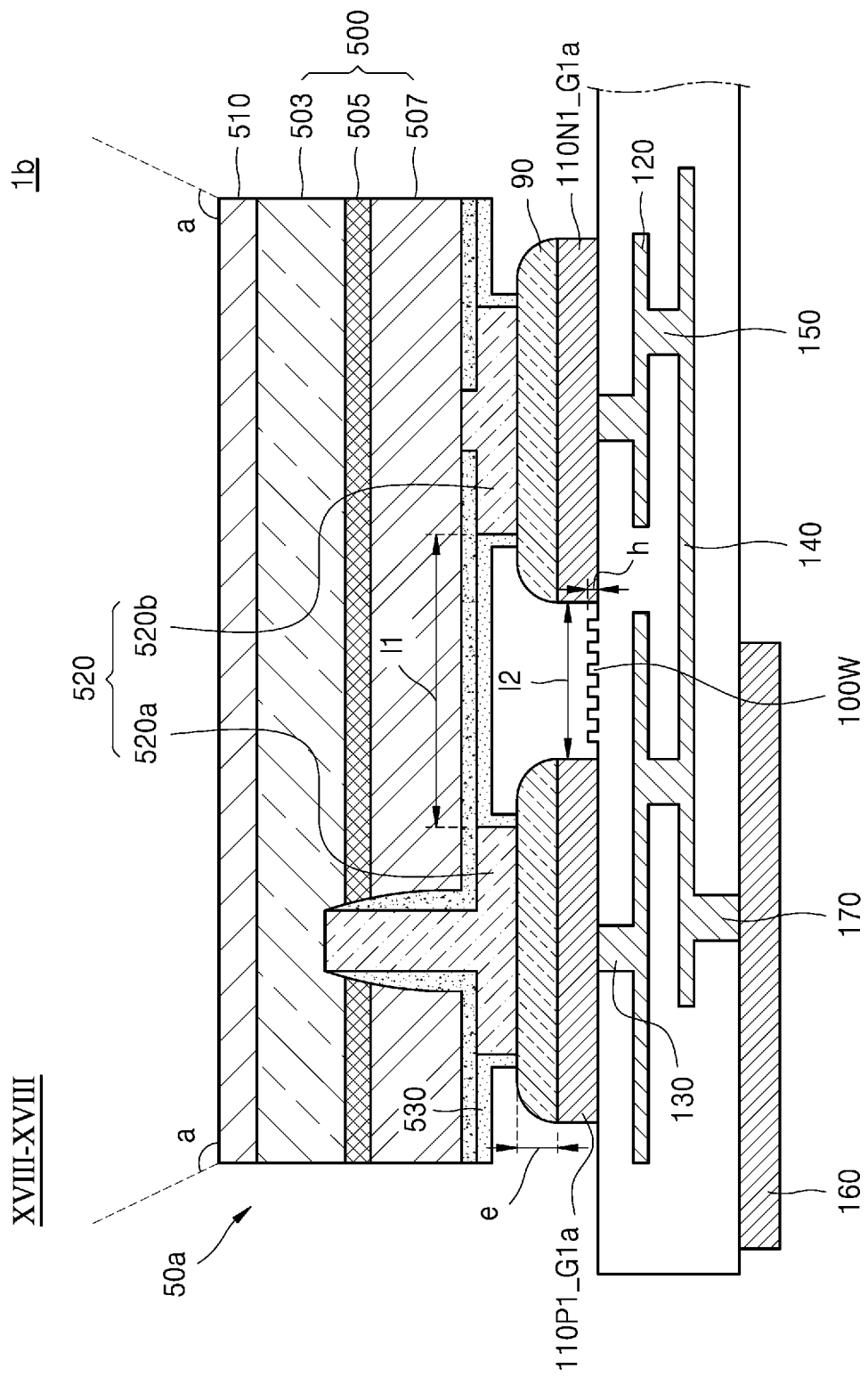

FIGS. 19 and 20 are cross-sectional views of light emitting device packages 1a and 1b, according to example embodiments, respectively. The light emitting device substrates 30a and 30b of the light emitting device packages 1a and 1b may include the insulating layer 100 having an uneven structure in which concaveness and convexity are repeated between the first anode upper pad 110P1_G1a and the first cathode upper pad 110N1_G1a, to suppress the ionic-migration effect.

Referring to FIG. 19, the insulating layer 100 of the light emitting device substrate 30a may include the plurality of grooves 100G in a portion between the first anode upper pad 110P1_G1a and the first cathode upper pad 110N1_G1a. In addition, the depth t of the plurality of grooves 100G may be about 5 micrometers to about 20 micrometers. For example, the depth t of the plurality of grooves 100G may be about 15 micrometers. However, the depth t of the plurality of grooves 100G is not limited thereto.

Referring to FIG. 20, the light emitting device substrate 30b may include the plurality of walls 100W protruding upward from the upper surface of the insulating layer 100 in a portion between the first anode upper pad 110P1_G1a and the first cathode upper pad 110N1_G1a. In addition, the height h of the plurality of walls 100W may be about 5 micrometers to about 20 micrometers. For example, the height h of the plurality of walls 100W may be about 15 micrometers. However, the height h of the plurality of walls 100W is not limited thereto.

In an example embodiment, the height of the upper surface of the plurality of walls 100W may be less than the height of the plurality of upper pads 110. In other words, the upper surface of the plurality of walls 100W may be at a lower level than the upper surface of the plurality of upper pads 110. Because the upper surface of the plurality of walls 100W is at a lower level than the upper surface of the plurality of upper pads 110, the plurality of walls 100W may not interfere with the light emitting device chip 50 mounted on the plurality of upper pads 110.

Figure 21:
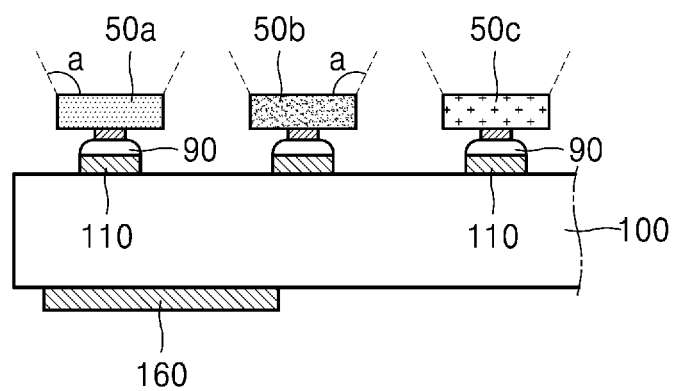
FIG. 21 is a cross-sectional view along line XXI-XXI in FIG. 17.

FIG. 21 is a cross-sectional view along line XXI-XXI in FIG. 17.

In the case of a general light emitting device package, a light emitting device chip and a light emitting device substrate may be electrically connected to each other by using wires. Accordingly, a wire pad for connecting the wires may be formed on an upper surface of the light emitting device chip. The wire pad on the upper surface of the light emitting device chip may increase the orientation angle a of light emitted from the light emitting device chip. In addition, the increased orientation angle a of the light emitting device chip may cause an optical interference phenomenon between adjacent pixels, and thus the color quality of light generated in the light emitting device chip may be deteriorated.

Referring to FIGS. 17 and 21, when a first length d1 of the light emitting device chip 50 is viewed from a planar perspective, the first length d1 of the light emitting device chip 50 may be defined as a length of the light emitting device chip 50 in the horizontal direction. In addition, a second length d2 of the light emitting device package 1 may be defined as a length of one pixel P in the horizontal direction. In addition, a third length d3 of the light emitting device package 1 may be defined as a distance in the horizontal direction between the centers of the light emitting device chips 50 emitting the same color.

To suppress an optical interference phenomenon of the light emitting device package 1, the first length d1 of the light emitting device chip 50 of the light emitting device package 1 may be determined based on the second length d2 and the third length d3 of the light emitting device package 1. In an example embodiment, when the second length d2 of the light emitting device package 1 is about 0.8 millimeters to about 1.0 millimeter, or the third length d3 of the light emitting device package 1 is about 1.0 millimeters to about 1.5 millimeters, the first length d1 of the light emitting device chip 50 may be determined as about 300 micrometers or less. In this case, the orientation angle a of the light emitting device chip 50 may be about 90 degrees to about 110 degrees. The orientation angle a of the light emitting device chip 50 may be about 90 degrees to about 110 degrees. Accordingly, the light interference phenomenon between adjacent pixels P of the light emitting device package 1 may be suppressed.

In an example embodiment, when the second length d2 of the light emitting device package 1 is about 0.6 millimeters to about 0.8 millimeter, or the third length d3 of the light emitting device package 1 is about 0.8 millimeters to about 1.0 millimeters, the first length d1 of the light emitting device chip 50 may be determined as about 200 micrometers or less. In this case, the orientation angle a of the light emitting device chip 50 may be about 90 degrees to about 110 degrees. The orientation angle a of the light emitting device chip 50 may be about 90 degrees to about 110 degrees. Accordingly, the light interference phenomenon between adjacent pixels P of the light emitting device package 1 may be suppressed.

In an example embodiment, when the second length d2 of the light emitting device package 1 is about 0.4 millimeters to about 0.6 millimeter, or the third length d3 of the light emitting device package 1 is about 0.6 millimeters to about 0.8 millimeters, the first length d1 of the light emitting device chip 50 may be determined as about 150 micrometers or less. In this case, the orientation angle a of the light emitting device chip 50 may be about 90 degrees to about 110 degrees. The orientation angle a of the light emitting device chip 50 may be about 90 degrees to about 110 degrees. Accordingly, the light interference phenomenon between adjacent pixels P of the light emitting device package 1 may be suppressed.

In an example embodiment, when the second length d2 of the light emitting device package 1 is about 0.2 millimeters to about 0.4 millimeter, or the third length d3 of the light emitting device package 1 is about 0.4 millimeters to about 0.6 millimeters, the first length d1 of the light emitting device chip 50 may be determined as about 100 micrometers or less. In this case, the orientation angle a of the light emitting device chip 50 may be about 90 degrees to about 110 degrees. The orientation angle a of the light emitting device chip 50 may be about 90 degrees to about 110 degrees. Accordingly, the light interference phenomenon between adjacent pixels P of the light emitting device package 1 may be suppressed, and quality of color generated in the light emitting device package 1 may be improved.

Hereinafter, methods of manufacturing the light emitting device substrate 20 will be described with reference to FIGS. 22 through 28. However, the methods of manufacturing the light emitting device substrate 20 are not limited thereto.

Figure 22:
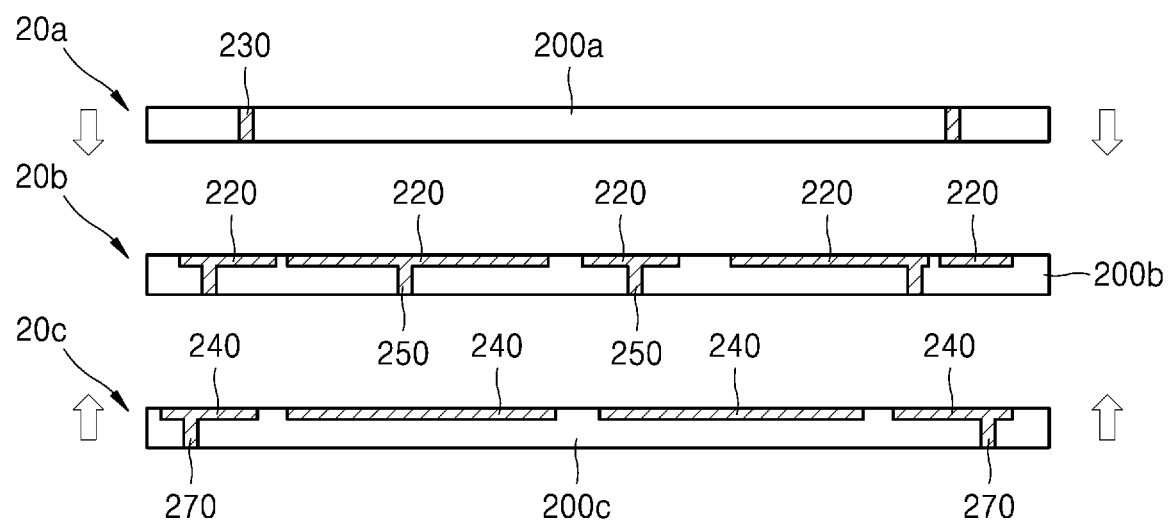
FIGS. 22 and 23 are cross-sectional views of stages in a manufacturing method of a light emitting device substrate, according to example embodiments.
Figure 23:
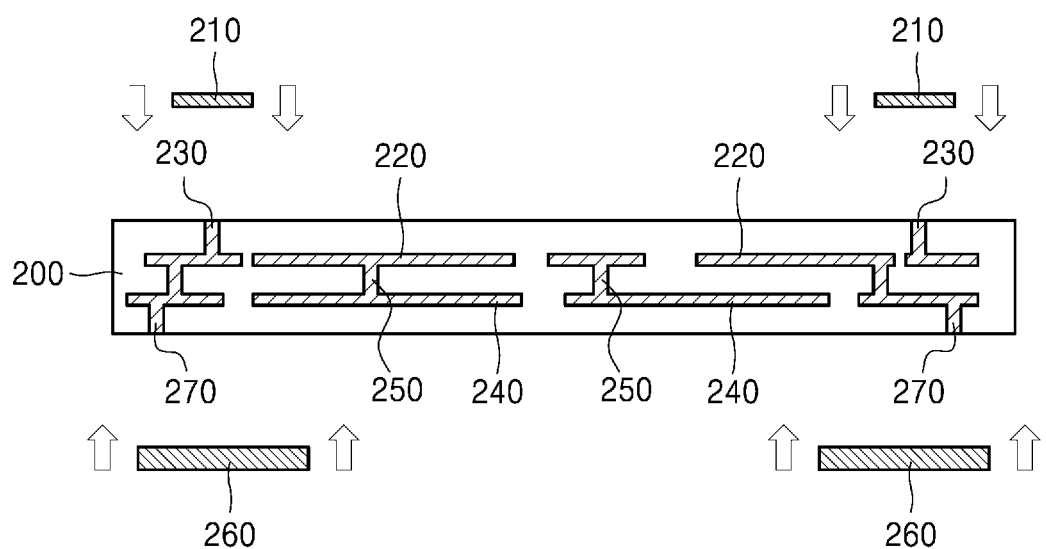

FIGS. 22 and 23 are diagrams of stages in a manufacturing method of the light emitting device substrate 20, according to embodiments. The manufacturing method in FIGS. 22-3 may be a method of manufacturing the light emitting device substrate 20 of FIG. 7 at a package level. In addition, the manufacturing method in FIGS. 22-3 may be applied to the manufacturing method of the light emitting device substrate 10 of FIG. 1.

Referring to FIG. 22, the manufacturing method may include manufacturing a plurality of PCBs and stacking the plurality of PCBs.

In an example embodiment, manufacturing the plurality of PCBs may include manufacturing a first PCB 20a including the first insulating layer 200a with the first conductive via 230 penetrating the first insulating layer 200a, manufacturing a second PCB 20b including a second insulating layer 200b with the first circuit pattern 220 exposed from the second insulating layer 200b and the second conductive via 250 connected to the first circuit pattern 220, and manufacturing a third PCB 20c including a third insulating layer 100c with the second circuit pattern 240 exposed from the third insulating layer 200c and the third conductive via 270. Stacking the first through third insulating layers 200a through 200c may form the insulating layer 200.

In detail, stacking the plurality of PCBs may include attaching the first PCB 20a to the second PCB 20b. The first PCB 20a and the second PCB 20b may be attached to each other and integrated into one body. In addition, the first conductive via 230 may contact the first circuit pattern 220, and may be electrically connected to the first circuit pattern 220.

In an example embodiment, stacking the plurality of PCBs may include attaching the second PCB 20b and the third PCB 20c. The second PCB 20b and the third PCB 20c may be attached to each other and integrated into one body. In addition, the second conductive via 250 may contact the second circuit pattern 240, and may electrically connect the first circuit pattern 220 to the second circuit pattern 240.

Referring to FIG. 23, the manufacturing method may further include mounting the plurality of upper pads 210 and the plurality of lower pads 260 on the insulating layer 200 (formed in FIG. 22).

In an example embodiment, the plurality of upper pads 210 may be mounted on the upper surface of the insulating layer 200, e.g., on the upper surface of the first insulating layer 200a, and connected to the first conductive via 130. Accordingly, the plurality of upper pads 210 may be electrically connected to the first circuit pattern 220 via the first conductive via 130. In addition, the plurality of lower pads 260 may be mounted on the insulating layer 200, e.g., on the lower surface of the third insulating layer 200c, and connected to the third conductive via 270. Accordingly, the plurality of lower pads 260 may be electrically connected to the second circuit pattern 240 via the third conductive via 270.

Figure 24:
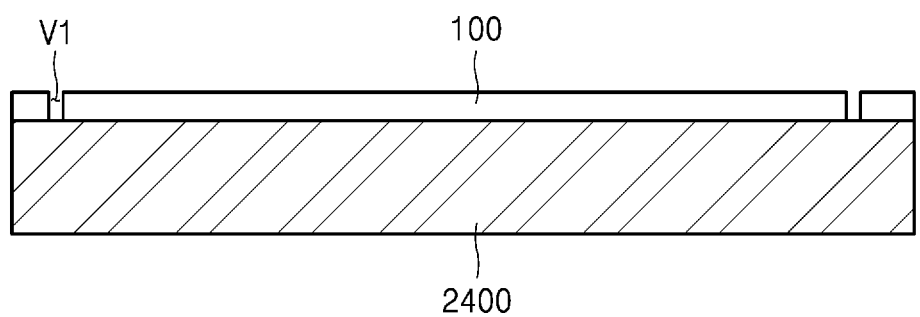
FIGS. 24 through 28 are cross-sectional views of stages in a manufacturing method of a light emitting device substrate, according to example embodiments.
Figure 27:
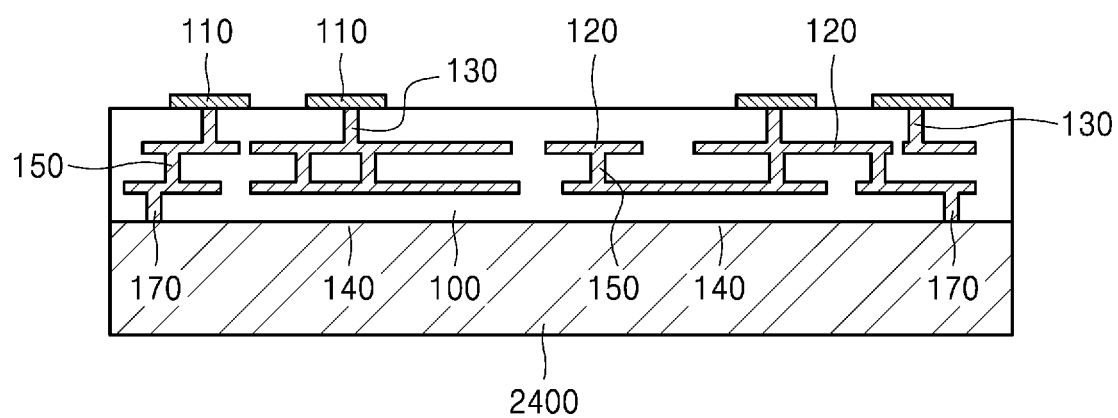
Figure 28:
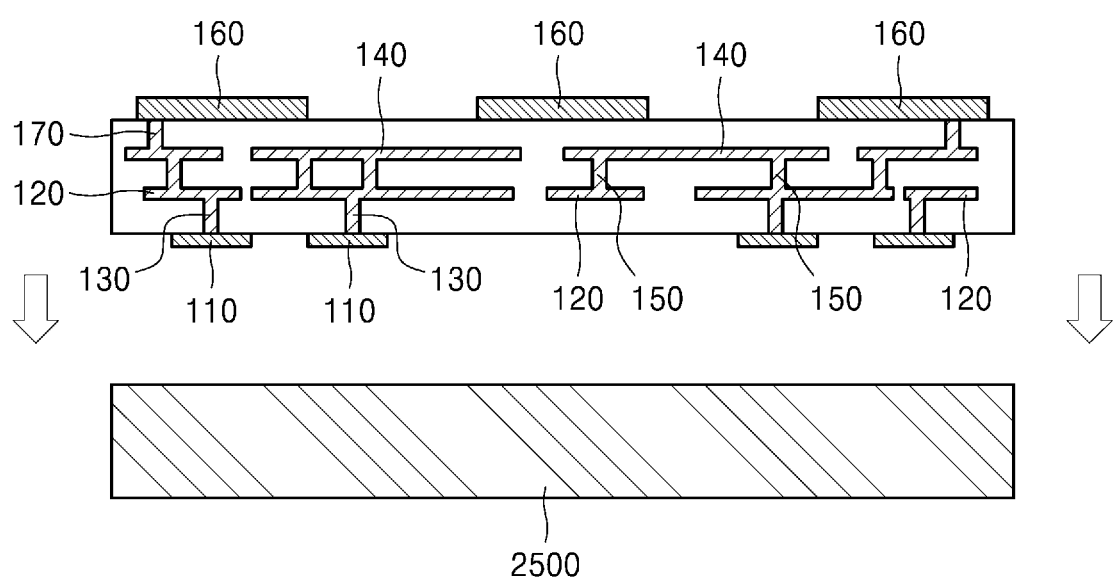

FIGS. 24 and 28 are diagrams of stages in a manufacturing method of the light emitting device substrate 20, according to embodiments. The manufacturing method in FIGS. 24-28 may be a method of manufacturing the light emitting device substrate 10 of FIG. 1 at a wafer level. In addition, the manufacturing method in FIGS. 24-28 may be applied to the manufacturing method of the light emitting device substrate 20 of FIG. 7.

Referring to FIG. 24, a manufacturing method of the light emitting device substrate 10 may include forming the insulating layer 100 and forming a first via hole V1 penetrating the insulating layer 100.

In an example embodiment, a first support substrate 2400 may be provided before forming the insulating layer 100. The first support substrate 2400 may include a substrate having stability against a photolithography process, an etching process, and a baking process. When the first support substrate 2400 is to be separated and removed later by using a laser ablation process, the first support substrate 2400 may be a transmissive substrate. In addition, when the first support substrate 2400 is to be separated and removed by heating, the first support substrate 2400 may include a heat-resistant substrate.

For example, forming the insulating layer 100 may include forming an insulating material, e.g., an epoxy resin, polybenzobisoxazole (PBO), benzocyclobutene (BCB), polyimide, and/or a polyimide derivative, on the first support substrate 2400. In another example, forming the insulating layer 100 may include forming an insulating material including an insulating material of a photo imageable dielectric (PID) material capable of a photolithography process (e.g., photosensitive polyimide (PSPI), polybenzobisoxazole (PBO), or the like) on the first support substrate 2400.

In an example embodiment, forming the first via hole V1 may include forming the first via hole V1 penetrating the insulating layer 100 by, e.g., an etching process, a reactive ion etching (RIE) process using plasma, and a laser drilling process.

Figure 25:
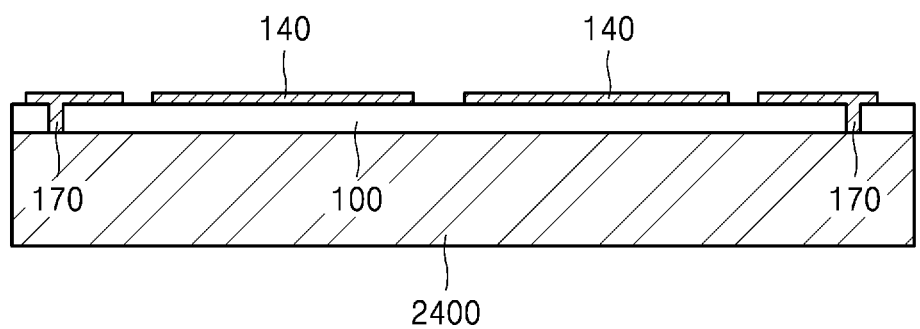

Referring to FIG. 25, the second manufacturing method of the light emitting device substrate 20 may include forming the third conductive via 170 and the second circuit pattern 140.

In an example embodiment, forming the third conductive via 170 and the second circuit pattern 140 may include conformally forming a seed layer on the top surface of the insulating layer 100. The seed layer may be formed by using a physical vapor deposition process, and the third conductive via 170 and the second circuit pattern 140 may be formed by using an electrolysis-less plating process. The third conductive via 170 may be formed in the first via hole (VI in FIG. 24), and the second circuit pattern 140 may be formed on the insulating layer 100. However, embodiments are not limited thereto.

Figure 26:
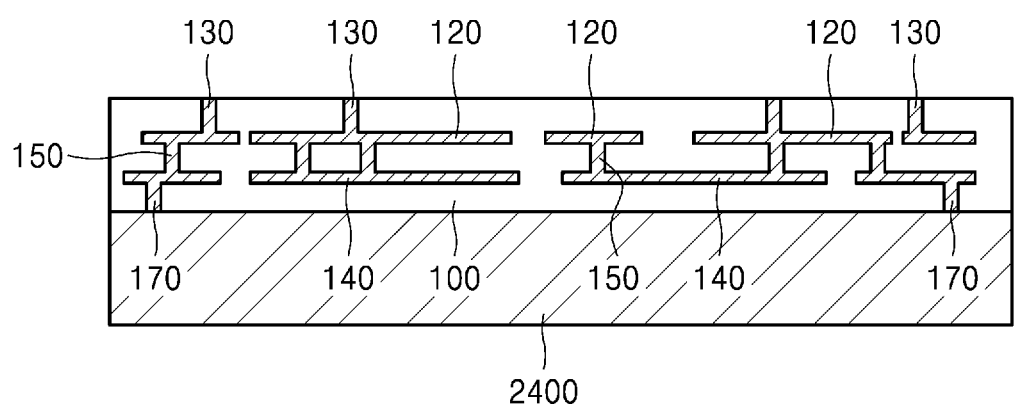

Referring to FIG. 26, the second manufacturing method of the light emitting device substrate 20 may include the second conductive via 150, the first circuit pattern 120, and the first conductive via 130. The technical idea of forming the second conductive via 150, the first circuit pattern 120, and the first conductive via 130 may be substantially the same as that described with reference to FIGS. 24 and 25, and thus detailed descriptions thereof are omitted.

Referring to FIG. 27, the second manufacturing method of the light emitting device substrate 20 may include mounting the plurality of upper pads 110 on the insulating layer 100. For example, mounting the plurality of upper pads 110 on the insulating layer 100 may include mounting the upper pads 110 on the insulating layer 100, and connecting the upper pads 110 to the first conductive via 130. Accordingly, the plurality of upper pads 110 may be electrically connected to the first circuit pattern 120 via the first conductive via 130.

Referring to FIG. 28, the second manufacturing method of the light emitting device substrate 20 may include mounting the plurality of lower pads 160 on the insulating layer 100. Before mounting the plurality of lower pads 160 on the insulating layer 100, the first support substrate 2400 may be performed. In addition, after removing the first support substrate 2400, inverting a structure of FIG. 27 may be performed. In addition, after inverting the structure of FIG. 27 is performed, attaching a second support substrate 2500 to the lower portion of the inverted structure of FIG. 27 may be performed.

In an example embodiment, mounting the plurality of lower pads 160 on the insulating layer 100 may include mounting the lower pads 160 on the insulating layer 100, and connecting the lower pads 160 to the first conductive via 130. Accordingly, the plurality of lower pads 160 may be electrically connected to the second circuit pattern 140 via the third conductive via 170. For example, after mounting the plurality of lower pads 160 on the insulating layer 100, removing the second support substrate 2500 may be performed.

By way of summation and review, an area and a height of a connecting member between a light emitting device chip and a substrate may be determined based on an area of a pad on the substrate. For example, when the area of the pad on the substrate is relatively large, an area of the connecting member may be large, and the height thereof may be small, e.g., based on spread of a solder ball. However, when the height of the connecting member is small, the bonding reliability between a light emitting device chip and the substrate via the connecting member may be low.

In contrast, embodiments provide a light emitting device substrate for improving the bonding reliability between the light emitting device chip and the substrate, and a light emitting device package including the same. In addition, embodiments provide a light emitting device substrate for improving quality of colors generated in a light emitting device chip and a light emitting device package including the same.

That is, according to embodiments, a plurality of upper pads of a light emitting device substrate may have substantially the same shape, size, and thickness, while being completely separated and spaced apart from each other on an upper surface of the light emitting device substrate, in a top view. Accordingly, when a connecting member, e.g., a solder ball, is positioned on such upper pads, it may have a smaller area and a larger height, e.g., as compared to a solder ball spreading on a larger area pad, thereby improving the bonding reliability between a light emitting device chip and the light emitting device substrate.

In addition, a plurality of lower pads may be arranged along a boundary, e.g., a peripheral area, of the lower surface of the light emitting device substrate, and may be provided at a lower number than the plurality of upper pads. Accordingly, defect identification and repair of a light emitting device package may be easier.

Further, the light emitting device package may electrically connect a light emitting device chip to the light emitting device substrate via a solder ball. In other words, the light emitting device package may not include a wire for electrically connecting the light emitting device chip to the light emitting device substrate. The light emitting device chip may not include a pad for connecting the wire thereon. Accordingly, color quality of the light emitting device package may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting device substrate, comprising:
an insulating layer having a first surface and an opposing second surface;
a plurality of upper pads spaced apart from each other in a matrix pattern, the plurality of upper pads contacting the first surface of the insulating layer and being in each region of M*N regions arranged in a matrix pattern (M and N are integers of one or more), each region of the M*N regions defining one pixel in which a grouping of the plurality of upper pads are arranged, the plurality of upper pads in each region of the M*N regions including an upper pad group having anode upper pads and cathode upper pads, the cathode upper pads of a first region of the M*N regions are electrically connected to the cathode upper pads of a second region of the M*N regions adjacent to the first region in a first direction, and at least one of the anode upper pads of the first region is electrically connected to at least one of the anode upper pads of a third region of the M*N regions adjacent to the first region in a second direction different from the first direction;

a first circuit pattern inside the insulating layer between the first surface and the second surface, the first circuit pattern electrically connecting some of the plurality of upper pads to each other;

a second circuit pattern inside the insulating layer between the first surface and the second surface, the second circuit pattern being between the first circuit pattern and the second surface of the insulating layer, and electrically connected to the first circuit pattern; and a plurality of lower pads spaced apart from each other and contacting the second surface of the insulating layer, wherein the plurality of lower pads is arranged along an outer boundary of the second surface of the insulating layer to surround a central portion of the insulating layer, wherein at least one of the plurality of lower pads is electrically connected to two or more upper pads of the plurality of upper pads via the first circuit pattern and the second circuit pattern, wherein a total number of the plurality of upper pads in the M*N regions is 6*M*N, and wherein a total number of the plurality of lower pads in the M*N regions is (3*M)+N.

2. The substrate as claimed in claim 1, wherein the plurality of upper pads have identical shapes and sizes.

3. The substrate as claimed in claim 1, further comprising:
a first conductive via through a first portion of the insulating layer, the first conductive via connecting the plurality of upper pads to the first circuit pattern;
a second conductive via through a second portion of the insulating layer, the second conductive via connecting the first circuit pattern to the second circuit pattern; and
a third conductive via through a third portion of the insulating layer, the third conductive via connecting the second circuit pattern to the plurality of lower pads.

4. The substrate as claimed in claim 1, wherein an area of a lower surface of one lower pad among the plurality of lower pads is greater than an area of an upper surface of one upper pad among the plurality of upper pads.

5. The substrate as claimed in claim 1, wherein the insulating layer between the plurality of upper pads has an uneven structure in which concaveness and convexity are repeated.

6. A light emitting device substrate defining M*N regions arranged in a matrix pattern (M and N are integers of one or more), each region of the M*N regions defining one pixel, the substrate comprising:
an insulating layer having a first surface and an opposing second surface;
a plurality of upper pads overlapping the first surface of the insulating layer, the plurality of upper pads being on each region of the M*N regions, and the plurality of upper pads on each region of the M*N regions including an upper pad group having anode upper pads and cathode upper pads, the cathode upper pads of a first region of the M*N regions being electrically connected to the cathode upper pads of a second region of the M*N regions adjacent to the first region in a first direction, and the anode upper pads of the first region being electrically connected to the anode upper pads of a third region of the M*N regions adjacent to the first region in a second direction different from the first direction; and a plurality of lower pads spaced apart from each other and overlapping the second surface of the insulating layer, the plurality of lower pads being arranged at an edge portion of the insulating layer to surround a central portion of the insulating layer, wherein a first portion of the first surface of the insulating layer between the anode upper pads and the cathode upper pads has an uneven structure shape in which concaveness and convexity are repeated, wherein an uppermost surface of the first portion of the insulating layer is lower than an uppermost surface of the plurality of upper pads relative to the first surface of the insulating layer, wherein a total number of the plurality of upper pads in the M*N regions is 6*M*N, and wherein a total number of the plurality of lower pads in the M*N regions is (3*M)+N.

7. The substrate as claimed in claim 6, wherein at least a portion of the insulating layer between the anode upper pads and the cathode upper pads has an uneven structure in which concaveness and convexity are repeated.

8. The substrate as claimed in claim 7, wherein the anode upper pads and the cathode upper pads have identical shapes and sizes, and are spaced apart from each other, respectively.

9. The substrate as claimed in claim 6, wherein the first portion of the insulating layer between the anode upper pads and the cathode upper pads has a plurality of holes.

10. The substrate as claimed in claim 6, further comprising a plurality of walls protruding upward from the first surface of the insulating layer between the anode upper pads and the cathode upper pads.

11. The substrate as claimed in claim 6, further comprising:
a first circuit pattern inside the insulating layer between the first surface and the second surface, and electrically connecting some upper pads among the plurality of upper pads; and
a second circuit pattern inside the insulating layer between the first surface and the second surface, the second circuit pattern being between the first circuit pattern and the second surface of the insulating layer inside the insulating layer, and electrically connected to the first circuit pattern.

12. A light emitting device package, comprising:
a light emitting device chip including a chip pad;
a light emitting device substrate, the light emitting device chip being mounted on the light emitting device substrate, and the light emitting device substrate including:
an insulating layer having a first surface and an opposing second surface,
a plurality of upper pads spaced apart from each other in a matrix pattern overlapping the first surface of the insulating layer and being on each region of M*N regions arranged in a matrix pattern (M and N are integers of one or more), the plurality of upper pads on each region of the M*N regions including an upper pad group having anode upper pads and cathode upper pads, the cathode upper pads of a first region of the M*N regions being electrically connected to the cathode upper pads of a second region of the M*N regions adjacent to the first region in a first direction, and the anode upper pads of the first region being electrically connected to the anode upper pads of a third region of the M*N regions adjacent to the first region in a second direction different from the first direction, a first circuit pattern inside the insulating layer between the first surface and the second surface, the first circuit pattern electrically connecting some of the plurality of upper pads to each other, a second circuit pattern inside the insulating layer between the first surface and the second surface, the second circuit pattern being between the first circuit pattern and the second surface of the insulating layer, and electrically connected to the first circuit pattern, and a plurality of lower pads spaced apart from each other and overlapping the second surface of the insulating layer, wherein the plurality of lower pads is arranged along an outer boundary of the second surface of the insulating layer to surround a central portion of the insulating layer, wherein a total number of the plurality of upper pads in the M*N regions is 6*M*N, wherein a total number of the plurality of lower pads in the M*N regions is (3*M)+N, and wherein at least one of the plurality of lower pads is electrically connected to two or more upper pads of the plurality of upper pads via the first circuit pattern and the second circuit pattern; and a connecting member between the chip pad and a corresponding one of the plurality of upper pads, wherein the connecting member electrically connects the light emitting device chip to the light emitting device substrate.

13. The package as claimed in claim 12, wherein the light emitting device chip includes:

a light emitting structure including a first conductivity semiconductor layer, a second conductivity semiconductor layer on the first conductivity semiconductor layer, and an active layer between the first conductivity semiconductor layer and the second conductivity semiconductor layer, and a transmissive material layer on the light emitting structure; and wherein the chip pad includes an anode chip pad connected to the first conductivity semiconductor layer and a cathode chip pad connected to the second conductivity semiconductor layer.

14. The substrate as claimed in claim 1, wherein the cathode upper pads of the first region of the M*N regions are electrically connected to the cathode upper pads of the second region of the M*N regions via the first circuit pattern, and wherein the at least one of the anode upper pads of the first region is electrically connected to at least one of the anode upper pads of the third region of the M*N regions via the first circuit pattern and the second circuit pattern.

15. The substrate as claimed in claim 6, wherein the cathode upper pads of the first region of the M*N regions are electrically connected to the cathode upper pads of the second region of the M*N regions via a first circuit pattern within the insulating layer, and wherein the at least one of the anode upper pads of the first region is electrically connected to at least one of the anode upper pads of the third region of the M*N regions via the first circuit pattern and a second circuit pattern inside the insulating layer, the second circuit pattern being between the first circuit pattern and the opposing second surface of the insulating layer.

16. The package as claimed in claim 12, wherein the cathode upper pads of the first region of the M*N regions are electrically connected to the cathode upper pads of the second region of the M*N regions via the first circuit pattern, and wherein the at least one of the anode upper pads of the first region is electrically connected to at least one of the anode upper pads of the third region of the M*N regions via the first circuit pattern and the second circuit pattern.

* * * * *